(12) United States Patent
Tada et al.

(10) Patent No.: US 6,844,598 B2
(45) Date of Patent: Jan. 18, 2005

(54) LATERAL HIGH BREAKDOWN VOLTAGE MOSFET AND DEVICE PROVIDED THEREWITH

(75) Inventors: Gen Tada, Nagano (JP); Masaru Saito, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/779,790

(22) Filed: Feb. 18, 2004

(65) Prior Publication Data

US 2004/0159856 A1 Aug. 19, 2004

Related U.S. Application Data

(62) Division of application No. 10/308,200, filed on Dec. 3, 2002.

(30) Foreign Application Priority Data

Dec. 4, 2001 (JP) ........................................ 2001-369980

(51) Int. Cl.[7] .............................................. H01L 23/62
(52) U.S. Cl. ...................................... 257/355; 257/500
(58) Field of Search ................................ 257/355, 339, 257/500, 409, 336, 335, 408, 366

(56) References Cited

U.S. PATENT DOCUMENTS 5,216,272 A * 6/1993 Kubokoya et al. .......... 257/409
5,300,451 A * 4/1994 Zambrano .................... 438/234
5,973,366 A   10/1999 Tada

FOREIGN PATENT DOCUMENTS

JP          08-236639       9/1996
JP          08-316469       11/1996

OTHER PUBLICATIONS

U.S. Appl. No. 10/308,200, filed May 29, 2002, Gen Tada et al.

J.A. Appels et al., High Voltage Thin Layer Devices (Resurf Devices) (1979), pp. 94–96.

* cited by examiner

*Primary Examiner*—David Nelms
*Assistant Examiner*—Thinh T Nguyen

(57) ABSTRACT

A film thickness of a gate oxide film of a lateral high breakdown voltage MOSFET of a first conduction type is formed with a thickness in which an electric field value to an absolute maximum rated voltage between a source and a drain becomes equal to or less than 4 MV/cm, and a drain diffused layer is formed so that a total amount of impurities therein becomes equal to or more than $2 \times 10^{12}/cm^2$ to reduce an on-resistance of the lateral high breakdown voltage MOSFET while ensuring a breakdown voltage thereof, and to reduce an area of the lateral high breakdown voltage MOSFET.

10 Claims, 14 Drawing Sheets

US 6,844,598 B2

LATERAL HIGH BREAKDOWN VOLTAGE MOSFET AND DEVICE PROVIDED THEREWITH

CROSS-REFERENCE TO RELATED APPLICATIONS

This application is a divisional of application Ser. No. 10/308,200, filed Dec. 3, 2002, now pending.

This application claims the benefit of Japanese Application No. 2001-369980, filed Dec. 4, 2001, and U.S. application Ser. No. 10/308,200, filed Dec. 3, 2002, the entire contents of which are incorporated by reference.

BACKGROUND OF THE INVENTION

1. Field of the Invention

The present invention relates to a lateral MOSFET, and more particularly to a lateral high breakdown voltage MOSFET with a breakdown voltage between a source and a drain of equal to or more than several tens of volts, or to a semiconductor device including the lateral high breakdown voltage MOSFET.

2. Description of the Related Art

FIG. 9 is a cross sectional view of a p-type lateral high breakdown voltage MOSFET 600 as a first example of a conventional one. The lateral high breakdown voltage MOSFET 600 has a p-type drain diffused layer 614 with a depth of about 1 mm formed by diffusion in a desired region of an n-type semiconductor substrate 601, and an n-well layer 605 formed by diffusion in a similar way on each surface side of the substrate 601 so as to surround an outer periphery of the drain diffused layer 614. In the n-well layer 605, a p-type source diffused layer 609 is formed from on a surface of the substrate 601 in a region apart by a specified distance from the above-described drain diffused layer 614. In the drain diffused layer 614, a p-type drain contact layer 610 is formed on the surface of the substrate 601 in a central region at an approximately equal distance from the boundary with the above-described n-well layer 605.

Moreover, on the surface of the n-well layer 605, a gate oxide film 607 is formed from a top end of the source diffused layer 609 over a top part of the drain-diffused layer 614. On a surface of the drain diffused layer 614, in a region without the drain contact layer 610 and the gate oxide film 607 being formed, there is formed a field oxide film 606.

A gate electrode 608 is formed above the gate oxide film 607 so as to project a part of the field oxide film 606. On the source diffused layer 609 and on the drain contact layer 610, a source electrode 612 and a drain electrode 613 are formed, respectively. The reference numeral 611 denotes an n+ contact layer on the n-well layer 605.

FIG. 10 is a view showing equipotential lines (20V interval) in a reverse-biased state in which a voltage of 100V is applied to the source electrode 612 and the gate electrode 608, and 0V to the drain electrode 613, with the lateral high breakdown voltage MOSFET 600 being turned off. A depletion layer expands on both sides from pn junctions between the p-type drain diffused layer 614 and the n-type semiconductor substrate 601, and the p-type drain diffused layer 614 and the n-well layer 605. In FIG. 10, the equipotential lines of 0V and 100V are approximately equal to respective ends of the depletion layer.

Optimization in the lateral high breakdown voltage MOSFET is to find a structure where a breakdown voltage of an element becomes maximum. Optimization using a RESURF (Reduced Surface Field) structure is known by the reference "High Voltage Thin Layer Device" (IEDM Proceedings, 1979, pp. 238–241).

In the first example of a conventional MOSFET shown in FIG. 9, there is formed on the n-type semiconductor substrate 601 the drain diffused layer 614, which corresponds to a drift region. Therefore, in order to cancel charges of n-type impurities in the n-type semiconductor substrate 601, a total amount of p-type impurities in the drain diffused layer 614 is established as being about $1 \times 10^{12}/cm^2$ which is made optimum in the above-described reference. Here, a total amount of the above-described impurities can be obtained by integrating a profile of the concentration (cm−3) in the drain diffused layer 614 with respect to a depth of the drain diffused layer 614. Thus, the depletion layer at the reverse-biased state is to extend mainly toward the drain diffused layer 614. Moreover, the gate electrode 608, being formed so as to project onto the field oxide film, provides a structure in which a field plate effect is obtained to make the depletion layer to easily extend into the drain diffused layer 614 for lessening an electric field near the surface thereof.

The lateral high breakdown voltage MOSFET 600 shown in FIG. 9 as the first example of conventional one, has a breakdown voltage of about 110V. To ensure the breakdown voltage, a projection (a distance indicated by "a" in FIG. 9) of the drain diffused layer 614 toward the n-well layer 605 and a channel length (a distance indicated by "b" in FIG. 9) determined by a distance from an end of the source diffused layer 609 to the drain diffused layer 614 are established as being in the order of 6 mm and 3 mm, respectively.

FIG. 11 is a cross sectional view of a second conventional p-type lateral high breakdown voltage MOSFET 700. The lateral high breakdown voltage MOSFET 700 has an n-well layer 705 deeply formed by diffusion in a desired region of a p-type semiconductor substrate 701 on an order of 10 mm from a surface of the semiconductor substrate 701, and a p-type drain diffused layer 714 with a depth of about 1 mm formed by diffusion on the surface side in the n-well layer 705. In the n-well layer 705, a p-type source diffused layer 709 is formed on a side of the substrate 701 surface in a region apart by a specified distance from a boundary of the drain diffused layer 714. In the drain diffused layer 714, a p-type drain contact layer 710 is formed on a side of the substrate surface 701 in a central region at an approximately equal distance from the boundary of the above-described n-well layer 705.

Moreover, on a surface of the n-well layer 705, a gate oxide film 707 is formed on an end of the source diffused layer 709 over a part of the drain diffused layer 714. On a surface of the drain diffused layer 714, in a region without the drain contact layer 710 and the gate oxide film 707 being formed, a field oxide film 706 is formed.

A gate electrode 708 is formed from above the gate oxide film 707 so as to project a part of the field oxide film 706. On the source diffused layer 709 and on the drain contact layer 710, a source electrode 712 and a drain electrode 713 are formed, respectively. The reference numeral 711 denotes an n+ contact layer of the n-well layer 705.

FIG. 12 is a view showing equipotential lines (20V interval) in a reverse-biased state in which a voltage of 100V is applied to the source electrode 712 and the gate 708, and 0V to the drain electrode 713, with the lateral high breakdown voltage MOSFET 700 being turned off. A depletion layer expands on both sides from a pn junction between the p-type drain diffused layer 714 and the n-well layer 705. In FIG. 12, the equipotential lines of 0V and 100V are approximately equal to respective ends of the depletion layer.

Moreover, when the p-type semiconductor substrate 701 is set at 0V, the p-type semiconductor substrate 701 and the n-well layer 705 are reverse-biased as shown in FIG. 12 to extend the depletion layer also to the pn junction.

In the second example of a conventional MOSFET shown in FIG. 11, the drain diffused layer 714, which corresponds to a drift region, is formed in the n-well layer 705. Therefore, in order to cancel charges of n-type impurities in the n-well layer 705, a total amount of p-type impurities in the drain diffused layer 714 is established as being about $1 \times 10^{12}/cm^2$ which is made optimum in the above-described reference. Thus, the depletion layer at the reverse-biased state extends mainly toward the drain diffused layer 714.

Moreover, the gate electrode 708, being formed so as to project onto the field oxide film 706, provides a structure in which a field plate effect is obtained to make the depletion layer to easily extend into the drain diffused layer 714 to lessen an electric field near a surface.

The lateral high breakdown voltage MOSFET 700 shown in FIG. 11, has a breakdown voltage of about 110V. To ensure the breakdown voltage, the projection (a distance indicated by "a" in FIG. 11) of the drain diffused layer 714 toward the n-well layer 705 and a channel length (a distance indicated by "b" in FIG. 11) determined by a distance from an end of the source diffused layer 709 to the drain diffused layer 714, are established as being in an order of 6 mm and 3 mm, respectively.

Next, an explanation will be made about a specific example of applying the lateral high breakdown voltage MOSFET, as described above, to a semiconductor integrated circuit (IC).

As such a specific example, there is a driver IC driving a plasma display panel (hereinafter referred to as PDP).

The PDP, being provided with a flat panel, suited to enlarge a screen, and capable of displaying a high quality image, receives attention as a display device that may substitute a CRT with a growing recent market scale. The PDP is a display in which electrodes on an address side are placed opposite to electrodes on a scanning side to emit light by carrying out charging and discharging with a high voltage of several tens volts or more applied across both opposing electrodes. The address side electrodes and the scanning sides electrodes are formed by several hundreds or more of electrodes to drive, of which driver ICs are used. Output circuits provided in the driver IC are several tens or more circuits. Thus, a number of the driver ICs are used for driving the above-described electrodes.

For example, for the driver IC to drive the address side electrodes, a 100V or more of breakdown voltage between the source and the drain, a ±30 mA of push-pull output, output numbers of 128 bits and the like are required. For a push-pull circuit, there are used high breakdown voltage n MOSFETs on a low potential side and p MOSFETs on a high potential side.

A comparison of the high breakdown voltage n MOSFET with a 30 mA output and a high breakdown voltage p MOSFET with a same output, shows that an area of the high breakdown voltage p MOSFET becomes two to three times the area of the high breakdown voltage n MOSFET, because the high breakdown voltage p MOSFET takes holes as carriers compared with the high breakdown voltage n MOSFET which takes electrons as carriers. A difference in carrier mobility is reflected in the areas of p MOSFET and n MOSFET.

An example of a high breakdown voltage p MOSFET applicable to the driver IC is disclosed in Japanese Patent No. 3198959. In this, element isolation is carried out by using an epitaxial wafer having a buried layer, an arrangement of which is shown in FIG. 13.

FIG. 13 is a cross sectional view of a third example of a conventional p-type lateral high breakdown voltage MOSFET 800. The lateral high breakdown voltage MOSFET 800 is formed with an n-type buried layer 802 in a desired region of a p-type semiconductor substrate 801, and has an n-well layer 805 formed by diffusion from a surface side of an epitaxial layer (not illustrated) formed on the n-type buried layer 802. An n+ wall layer 803 surrounds the outer periphery of the n-well layer 805 and is formed by diffusion down to a depth reaching the n-type buried layer 802. A p-type drain diffused layer 814 with a depth of about 1 mm is formed by diffusion from the surface side in the n-well layer 805. In the n-well layer 805, a p-type source diffused layer 809 is formed from the side of the substrate surface in a region apart by a specified distance from a boundary with the above-described drain diffused layer 814. In the drain diffused layer 814, a p-type drain contact layer 810 is formed from the side of the substrate surface in a central region at an approximately equal distance from the boundary with the above-described n-well layer 805. On the outside of the n+ wall layer 803, a p-well layer 804 is formed to electrically isolate the lateral high breakdown voltage MOSFET 800 from the substrate 801.

Moreover, on the surface of the n-well layer 805, a gate oxide film 807 is formed from an end of the source diffused layer 809 over a part of the drain diffused layer 814. On the surface of the drain diffused layer 814, in a region without the drain contact layer 810 and the gate oxide film 807 being formed, a field oxide film 806 is formed.

A gate electrode 808 is formed from above the gate oxide film 807 so as to project onto a part of the field oxide film 806. On the source diffused layer 809 and on the drain contact layer 810, a source electrode 812 and a drain electrode 813 are formed, respectively.

As described above, by providing the n-type buried layer 802 and the n+ wall layer 803, a current leaking from the element region to the substrate 801 can be reduced. The reference numeral 811 denotes an n+ contact layer to the n-well layer 805.

FIG. 14 is a view showing equipotential lines (20V interval) in a reverse-biased state in which a voltage of 100V is applied to the source electrode 812 and the gate 808, and 0V to the drain electrode 813, with the lateral high breakdown voltage MOSFET 800 being turned off. A depletion layer expands on both sides from a pn junction between the p-type drain diffused layer 814 and the n-well layer 805. In FIG. 14, the equipotential lines of 0V and 100V are approximately equal to respective ends of the depletion layer. Moreover, when the p-type semiconductor substrate 801 is made at 0V, the p-type semiconductor substrate 801 and the n-type buried layer 802 are also reverse-biased, as shown in FIG. 14, to extend the depletion layer from the pn junction.

In the third example of the conventional MOSFET shown in FIG. 13, there is formed in the n-well layer 805 the drain diffused layer 814, which corresponds to a drift region. Therefore, in order to cancel charges of n-type impurities in the n-well 805, a total amount of p-type impurities in the drain diffused layer 814 is established as being about $1 \times 10^{12}/cm^2$ which is made optimum in the above-described reference. Thus, the depletion layer at the reverse-biased state is to extend mainly toward the drain diffused layer 814.

Moreover, the gate electrode 808, being formed so as to project onto the field oxide film, provides a structure in which a field plate effect is obtained to make the depletion layer to easily extend into the drain diffused layer 814 to lessen an electric field near the surface thereof.

The lateral high breakdown voltage MOSFET 800 shown in FIG. 13 has a breakdown voltage of about 110V. To ensure the breakdown voltage, the projection (a distance indicated by "a" in FIG. 13) of the drain diffused layer 814 toward the n-well layer 805 and a channel length (a distance indicated by "b" in FIG. 13) determined by a distance from an end of the source diffused layer 809 to the drain diffused layer 814, are established as being in an order of 6 mm and 3 mm, respectively.

As has been explained before, in each of the above-described first to third examples of conventional MOSFETs, the RESURF structure is presented in which the depletion layer extends toward the drain diffused layer (614, 714, 814). Another characteristic of each of the lateral high breakdown voltage p MOSFETs is that an electric field strength in the gate oxide film can be suppressed.

As described before, in the reverse-biased state (turned off state) in which the voltage of 100V is applied to the source electrodes (612, 712, 812) and the gates (608, 708, 808), and 0V to the drain electrodes (613, 713, 813), the drain diffused layers (614, 714, 814) and the field oxide films (606, 706, 806), each with a thickness on the order of 800 nm, mainly carry the reverse-bias voltages, which is apparent from the equipotential lines shown in FIG. 10, FIG. 12, and FIG. 14.

Meanwhile, the reverse-bias voltages born by the n-well layers (605, 705, 805) and the gate oxide films (607, 707, 807) are 10V or less of the reverse-bias voltages of 100V. Therefore, when the thicknesses of the gate oxide films (607, 707, 807) are made as 25 nm, the electric field strengths in the gate oxide films (607, 707, 807) become 4 MV/cm or less for the above-described 10V to ensure reliability of the gate oxide films.

That is, the above-explained RESURF structure is a structure by which the breakdown voltage between the source and the drain is made maximum to make the gate oxide film carry no reverse-bias voltage in the turned off state. Because of the structure in which no voltage is carried by the gate oxide film, a relatively thin gate oxide film is used.

Problems in the arrangement of carrying most of the source-to-drain voltage with the drain diffused layer and the field oxide film as in the conventional MOSFETs as explained before (RESURF structure) will be explained in the next section.

As has been explained, in the first to third examples of conventional MOSFETs, the RESURF structure is employed to optimize a structure to make the breakdown voltage maximum of an element. Therefore, a total amount of the p-type impurities in each of the drain diffused layers (614, 714, 814) becoming drift regions is established as being in the order of $1 \times 10^{12}/cm^2$. Moreover, each of the projections of the drain diffused layers (614, 714, 814) toward the n-well layers (605, 705, 805) is established as being in the order of 6 mm.

Such RESURF structure is an effective approach to enhance a breakdown voltage of an element. On the other hand, the structure has a problem of providing high on-resistance.

First, a total amount of impurities in the drain diffused layer is low. Namely, with the total amount of impurities in the drain diffused layer as being on the order of about $1 \times 10^{12}/cm^2$, the resistance of the drain diffused layer is increased. A drain resistance occupies a major fraction of the on-resistance components of the lateral high breakdown voltage MOSFET with the RESURF structure. The drain resistance occupies about 90%. A channel resistance is on the order of 10%. The drain resistance is the resistance of the drain diffused layer with sheet resistance of the drain diffused layer given as about 12 k$\Omega$/square in the above-described examples of the conventional MOSFETs.

Second, the projected length of the drain diffused layer is long. Namely, in order to ensure a breakdown voltage between the source and the drain, the length has been established as being in the order of 6 mm in the above-described examples. As the length becomes longer, the on-resistance increases.

To reduce the on-resistance, an impurity concentration in the drain diffused layer can be increased. The increased concentration, however, causes a problem of making the drain diffused layer hard to become depleted. In addition, the drain diffused region, being formed with a shallow diffused depth of about 1 mm, enhances the electric field at the cylindrical portion as the impurity concentration is increased, which causes a problem of reducing the breakdown voltage between the source and the drain.

Therefore, the impurity concentration in the drain diffused layer cannot be simply increased. Hence, the impurity concentration in the drain diffused layer is inevitably made lower to cause a problem of increasing the on-resistance.

SUMMARY OF THE INVENTION

In accordance with an aspect of the present invention, there if provided reducing on-resistance of a lateral high breakdown voltage MOSFET while ensuring a breakdown voltage thereof, in particular, to reduce an area of a lateral high breakdown voltage p MOSFET, and to provide a semiconductor device such as a PDP driver IC at a reduced cost by reduction in an element area.

In order to achieve an aspect of the present invention, a voltage that is turned-off between a source and a drain is shared by a gate oxide film by making short a projection of a drain diffused layer toward the source rather than enlarging a projection of the drain region and reducing an impurity concentration in the drain diffused layer as in a conventional MOSFET. Thus, the following arrangement has been formed.

Namely, in the lateral high breakdown voltage MOSFET of a first conduction type, a gate oxide film (a silicon oxide film) may be provided formed from an end of a source diffused layer over a part of the drain diffused layer of a surface of a body diffused layer. Further, a field oxide film may be formed on a surface of the drain diffused layer, in a region without a drain contact diffused layer and the gate oxide film. A gate electrode may be formed from above the gate oxide film over a part of the field oxide film, in which a thickness of the gate oxide film is a thickness in which an electric field value to an absolute maximum rated voltage between the source and the drain becomes equal to or less than 4 MV/cm, and a total amount of impurities in the above-described drain diffused layer is equal to or more than $2 \times 10^{12}/cm^2$.

Increased concentration in the drain diffused layer makes the drain diffused layer hard to become depleted, by which the depletion layer becomes to extend toward the body diffused layer (n-well layer) side.

Incidentally, even with surface impurity concentration of the drain diffused layer of the same order as those in the above-described examples of the conventional MOSFETs (for example, of the order of $2 \times 10^{16}/cm^3$), a total amount of impurities can be increased by deeply diffusing the drain diffused layer to obtain the total amount of impurities exceeding an optimum condition ($1\times10^{12}/cm^2$) for a RESURF structure. Here, the total amount of impurities in the drain diffused layer can be made as $2\times10^{12}/cm^2$ or more. Further, the depth of the drain diffused layer can be a depth reaching a buried layer.

The total amount of impurities can be increased by increasing an amount of ion implantation in the drain diffused layer and carrying out diffusion at a high temperature for a long time. However, high impurity concentration in a surface of a substrate more than necessary will provide an electric field becoming high near the surface of the drain diffused layer on the source side to cause reduction in the breakdown voltage. As explained above, even with the surface impurity concentration of the drain diffused layer of the same order as those in the examples of the conventional MOSFETs, the total amount of impurities can be increased by deeply diffusing the drain diffused layer. Furthermore, by increasing a surface impurity concentration more than those in the conventional MOSFETs within a range of causing none of the above-explained reduction in the breakdown voltage, the total amount of impurities can be further increased in the drain diffused layer.

With the increase in the total amount of impurities in the drain diffused layer, the on-resistance of the drain is reduced.

By adopting the above-described arrangement according to an aspect of the invention, the drain diffused layer is made hard to become depleted, by which the depletion layer extends toward the body diffused layer side. Thus, the projection of the drain diffused layer toward the source side can be shortened.

Here, by the gate electrode projecting long onto the field oxide film, the depletion layer is made easy to extend toward the drain contact layer by a field plate effect. That is, the shortened projection of the drain diffused layer toward the source side brings an end of the depletion layer close to the drain contact layer by the above-described field plate effect. The depletion layer reaching the drain contact layer enhances an electric field at the portion to cause reduction in a breakdown voltage.

To reduce a resistance of the drain diffused layer, the projection of the drain diffused layer toward the source side can be shortened. However, by simply shortening the projection distance causes a reduction in the breakdown voltage for the above-described reason.

Thus, the projection of the drain diffused layer may be shorten toward the source side, and along with this, to shorten a projection of the gate electrode onto the field oxide film because the shortened projection of the gate electrode suppresses the field plate effect. For example, the length of the above-described gate electrode on the above-described field insulator layer may be provided as being equal to or less than 2 mm.

With such an arrangement, the projection of the drain diffused layer toward the source side can be shortened to provide a low resistance in the drain diffused layer, which is also effective to reduce a device pitch.

Furthermore, in a comparison of extensions of the depletion layers, letting a width of a depletion layer to extend toward the side of the drain diffused layer of the first conduction type be W1 and a width of a depletion layer to extend toward the side of the body diffused layer of the second conduction type be W2, widths of the depletion layers on an uppermost surface side of the semiconductor layer, when reverse-bias voltage is applied between the source and the drain are given as W1<W2.

In such arrangement, a considerable part (for example, 80%) of the voltage between the source and the drain is to be carried by the gate oxide film. The gate electrode, being formed having a thickness in which a value of the electric field to an absolute maximum rated voltage between the source and the drain becomes equal to or less than 4 MV/cm, no breakdown is caused to ensure reliability.

As explained above, a thickened gate oxide film raises a threshold voltage to reduce mutual conductance (Gm). This, however, provides sufficient drivability when a gate driving voltage of the p-type lateral high breakdown voltage MOSFET is as high as a drain voltage as in the case in which the MOSFET is applied to, for example, a PDP driver IC.

Here, when the absolute maximum rated voltage is high and the gate oxide film is thick, the thickness of the gate oxide film and the thickness of the field oxide film can be made on the same order.

When an insulator film other than the silicon oxide film (for example, a nitride film or other kinds of oxide films etc.) is applied to the gate insulator film, the film thickness is determined depending on a material of the insulator film. The determination is made so that an electric field has a value equal to or less than a value that causes no breakdown of the insulator film in the case the absolute maximum rated voltage between the source and the drain is applied to the insulator film.

Moreover, a diffused layer (p-type) formed simultaneously with a p-type drain diffused layer of the p-type lateral high breakdown voltage MOSFET can be used for a body diffused layer of an n-type lateral high breakdown voltage MOSFET. In the same way, a diffused layer (n-type) formed simultaneously with an n-type body diffused layer of the p-type lateral high breakdown voltage MOSFET can be used for a drain diffused layer of the n-type lateral high breakdown voltage MOSFET.

Further, diffused layers respectively formed simultaneously with the above-described p-type diffused layer and the n-type diffused layer, can be provided as device forming regions (wells) to form a low breakdown voltage MOSFET in each of the device forming regions.

Here, the diffused layers formed simultaneously are referred to as those formed in the same process. For example, in an ion implantation process to form a diffused layer of the p-type lateral high breakdown voltage MOSFET, ion implantations are carried out simultaneously also in a body diffused layer forming region of the n-type lateral high breakdown voltage MOSFET and a low breakdown voltage MOSFET forming region (a well region). With a diffusion process carried out subsequently, diffused layers for a plurality of different types of devices can be formed simultaneously.

These together with other aspects and advantages which will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1:
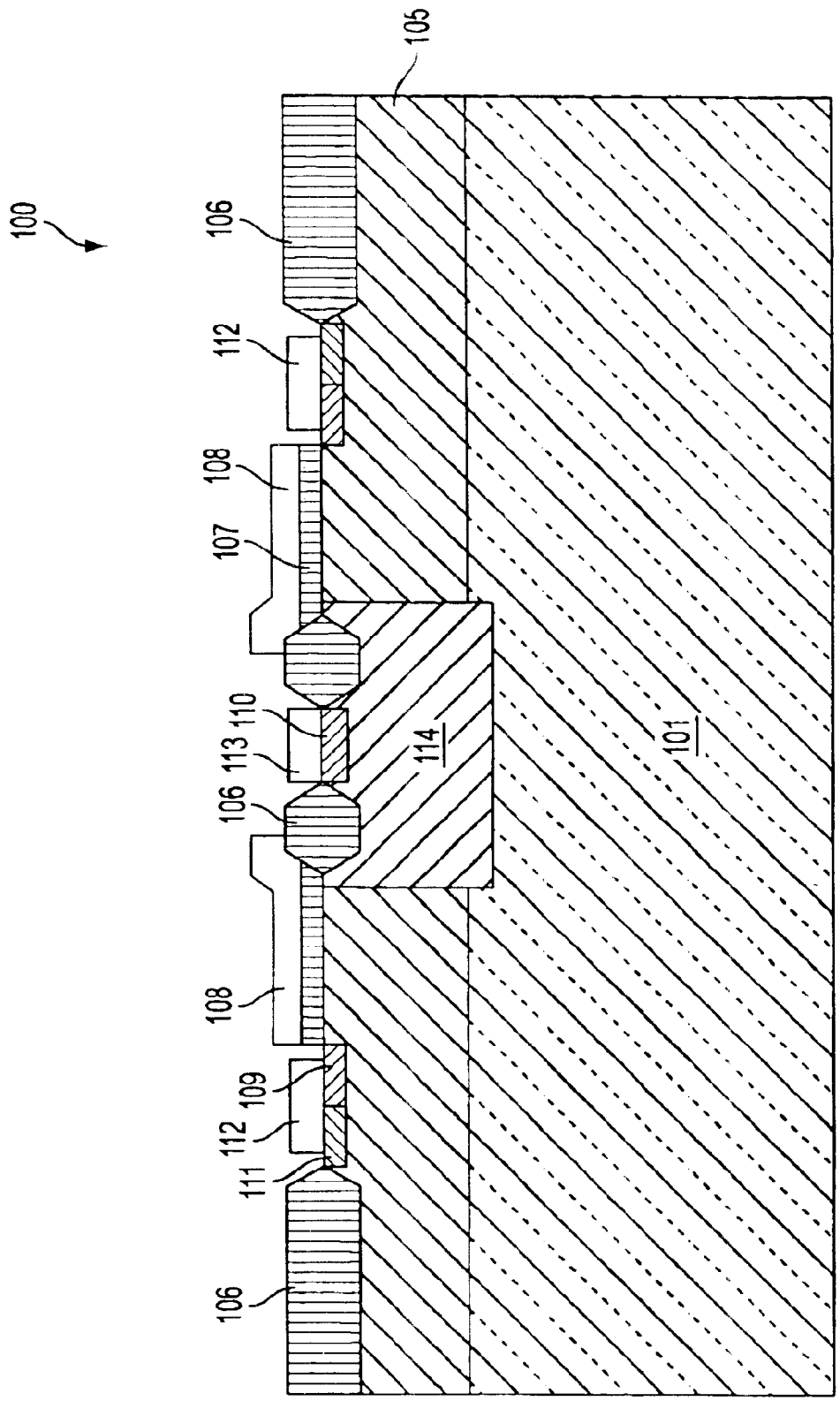
FIG. 1 illustrates a cross sectional view showing a first aspect of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

FIG. 1 is a cross sectional view of a p-type lateral high breakdown voltage MOSFET 100, in accordance with a first aspect of the present invention.

The lateral high breakdown voltage MOSFET 100 has a p-type drain diffused layer 114 formed by diffusion in a desired region of an n-type semiconductor substrate 101 from a surface of the semiconductor substrate 101, and an n-well layer 105 formed by diffusion in a similar way from the surface side of the n-type semiconductor substrate 101 so as to surround an outer periphery (side face) of the drain diffused layer 114.

The drain diffused layer 114 is in contact with the n-type semiconductor substrate 101 with a bottom face thereof, with a side face thereof being in contact with the n-well layer 105 except for a corner portion with the bottom face.

The n-well layer 105 and the drain diffused layer 114 are formed by selectively injecting impurities with desired doses in a forming region of the n-well layer 105 and a forming region of the drain diffused layer 114, respectively, before the injected impurities are simultaneously diffused.

In the n-well layer 105, a p-type source diffused layer 109 is formed from a side of a surface of the n-type semiconductor substrate 101 in a region apart by a specified distance from a boundary with the above-described drain diffused layer 114. In the drain diffused layer 114, a p-type drain contact layer 110 is formed from the side of the n-type semiconductor substrate 101 surface in a central region at an approximately equal distance from the boundary with the n-well layer 105.

Moreover, on a surface of the n-well layer 105, a gate oxide film 107 is formed from an end of the source diffused layer 109 over a part of the drain diffused layer 114. Furthermore, of the surface of the drain diffused layer 114, in a region without the drain contact layer 110 and the gate oxide film 107 being formed, a field oxide film 106 is formed.

A gate electrode 108 is formed above the gate oxide film 107 to project a part of the field oxide film 106. On the source diffused layer 109 and on the drain contact layer 110, a source electrode 112 and a drain electrode 113 are formed, respectively.

Here, a distance between the source diffused layer 109 and the drain diffused layer 114 is formed longer than a projected length of the drain diffused layer 114 from the drain contact layer 110 toward the source diffused layer 109. Moreover, the film thickness of the gate oxide film 107 is formed to such a thickness in which an electric field value of an absolute maximum rated voltage between the source and the drain becomes equal to or less than 4 MV/cm. The reference numeral 111 denotes an n+ contact layer to the n-well layer 105.

As an example of an aspect of the present invention, a film thickness of the gate oxide film 107 is 250 nm and the film thickness of the field oxide film 106 is 800 nm. In particular, a width of the field oxide film 106 formed between the source and the drain is 2 mm. Moreover, the n-well layer 105 is diffused down to a depth of about 5 mm and the drain diffused layer 114 is diffused down to a depth of about 6 mm. The drain diffused layer 114 has a sheet resistance of 4 kΩ/square and a total amount of p-type impurities of $3.0 \times 10^{12}/cm^2$. A distance between the source diffused layer 109 and the drain diffused layer 114 (a channel length) is about 5 mm and the projection of the gate electrode 108 onto the field oxide film 106 is on the order of 1 mm. A breakdown voltage of the lateral high breakdown voltage MOSFET 100 is on the order of 110V and the absolute maximum rated voltage thereof is 80V.

Figure 2:
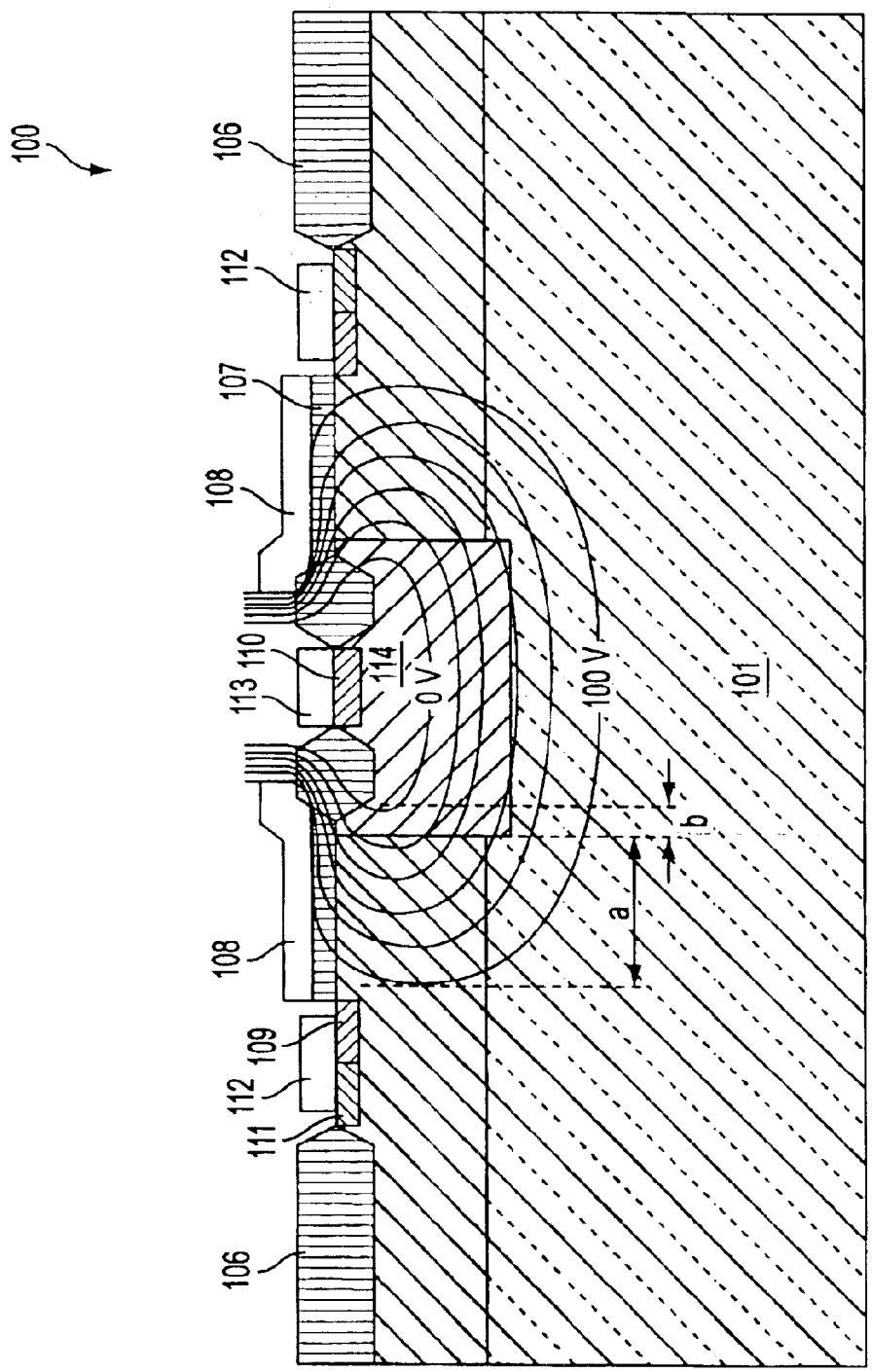
FIG. 2 illustrates a view showing equipotential lines in the first aspect of the present invention.

FIG. 2 is a view showing equipotential lines (20V interval) in a state in which a voltage of 0V is applied to the source electrode 112 and the gate electrode is applied 108, and 100V to the drain electrode 113, with the lateral high breakdown voltage MOSFET 100 being turned off. A depletion layer expands on both sides from pn junctions between the p-type drain diffused layer 114 and the n-type semiconductor substrate 101, and the p-type drain diffused layer 114 and the n-well layer 105. In FIG. 2, the equipotential lines of 0V and 100V are approximately equal to respective ends of the depletion layer.

In a vicinity of a surface of silicon, an expansion of the depletion layer extending from the above-described pn junction is presented in which, a width of the depletion layer extending into the n-well layer 105 (a distance indicated by "a" in FIG. 2) becomes wider than the width of the depletion layer extending into the drain diffused layer 114 (a distance similarly indicated by "b"). That is, the depletion layer expands mainly towards the n-well layer 105. Thus, most of a reverse-bias voltage between the source and the drain being turned off is carried by the n-well layer 105.

As explained above, the distance between the source diffused layer 109 and the drain diffused layer 114 (the channel length) is formed longer than a projected length of the drain diffused layer 114 toward the source diffused layer 109. Therefore, even though the depletion layer extends into the n-well layer 105, no depletion layer reaches the source diffused layer 109 to cause no punch-through.

Moreover, as is also apparent from the equipotential lines shown in FIG. 2 passing through in the gate oxide film 107, a considerable portion of the voltage is carried by the gate oxide film 107.

In an exemplary aspect of the present invention, the gate oxide film 107 is formed to have such a thickness that the electric field value to the absolute maximum rated voltage between the source and the drain becomes equal to or less than 4 MV/cm (for example, 250 nm). Therefore, even though all of the absolute maximum rated voltage between the source and the drain is carried by the gate oxide film 107, the electric field strength in the gate oxide film is 3.2 MV/cm. This causes no breakage of the gate oxide film to ensure reliability.

By employing the above-described arrangement according to an aspect of the invention, the drain diffused layer 114 is made hard to be depleted to make the depletion layer extend toward the diffused layer side. Thus, a projection of the drain diffused layer 114 from the drain contact layer 110 toward the source side can be made short.

Here, by the gate electrode projecting long onto the field oxide film, the depletion layer is made easy to extend toward the drain contact layer by a field plate effect. That is, the shortened projection of the drain diffused layer 114 toward the source side brings an end of the depletion layer close to the drain contact layer 110 by the above-described field plate effect. The depletion layer reaching the drain contact layer enhances the electric field at that portion to cause reduction in a breakdown voltage.

To reduce a resistance of the drain diffused layer, the projection of the drain diffused layer 114 toward the source side can be shortened. However, simply shortened projection distance causes reduction in the breakdown voltage for the above-described reason.

Thus, in accordance with an aspect of the present invention, the projection of the drain diffused layer 114 is shorten towards the source side, and, the projection of the gate electrode 108 is shorten onto the field oxide film because the shortened projection of the gate electrode 108 suppresses the field plate effect.

With such an arrangement, the projection of the drain diffused layer 114 from the drain contact layer 110 toward the source side can be shortened to provide low resistance in the drain diffused layer. This is also effective to reduce a device pitch.

In an exemplary aspect of the present invention, the projection of the gate electrode 108 onto the field oxide film 106 is established as being on the order of 1 mm to suppress extension of the depletion layer into the drain diffused layer 114. A drift length of a drain diffused region (the length of the projection from the drain contact layer 110) is shorten on the order of 3 mm so that the resistance of the drain diffused layer can be reduced.

As explained above, the depletion layer extends mainly toward the n-well layer 105. Thus, a total amount of impurities in the drain diffused layer may be established to be three times to thereby make the sheet resistance as being ⅓ compared to a conventional MOSFET. Furthermore, the drift length also becomes ½. Most of the on-resistance component (of the order of 90%) in the lateral high breakdown voltage MOSFET 100 is occupied by drain resistance. The drain resistance can be brought to ⅙.

Moreover, the distance between the source diffused layer 109 and the drain diffused layer 114 (the channel length), being longer (on the order of 5 mm) than the projected length of the drain diffused layer 114 toward the source diffused layer 109, may become ⅚ times compared with about 3 mm of that of the conventional MOSFET. However, a proportion of the channel resistance occupying the on-resistance may be on the order of 10%. Thus, a sum of the drain resistance (on the order of 90% of the on-resistance) and the channel resistance (on the order of 10% of the same) is given as shown in expression (1):

$$90\% \times (\frac{1}{6}) + 10\% \times (\frac{3}{5}) \approx 32\%, \quad (1)$$

which is reduced to on the order of ⅓ of a conventional one. Furthermore, about the length as the channel length plus a length of the drift region, it is also somewhat shortened as 8 μm compared with a conventional 9 μm.

That is, the p-type lateral high breakdown voltage MOSFET with equal on-resistance to that of a conventional MOSFET can be formed with a channel width (a length in the perpendicular direction to the sheet of FIG. 1) of ⅓ of that of the conventional MOSFET. Furthermore, along with reduction in a device pitch due to reduction in the length as the above-described channel length plus the length of the drift region, the device area can be reduced down to ⅓ or less.

With the arrangement as described above, the gate oxide film 107 is thickened to raise a threshold voltage, which reduces a mutual conductance (Gm) and provides sufficient drivability when a gate driving voltage of the p-type lateral high breakdown voltage MOSFET is as high as a drain voltage.

With respect to an aspect of the present invention of forming an integrated circuit device (IC) by integrating a plurality of p-type lateral high breakdown voltage MOSFETs, an area of each individual lateral high breakdown voltage p MOSFET becomes ⅓ or less which allows considerable downsizing of the integrated circuit device.

Furthermore, in the case of forming the integrated circuit device by integrating the p-type lateral high breakdown voltage MOSFET together with an n-type lateral high breakdown voltage MOSFET, a driving circuit for the high breakdown voltage devices, other peripheral circuits, and the like, an area of the p-type lateral high breakdown voltage MOSFET previously having occupied a large area becomes ⅓ or less, which allows the integrated circuit device to be downsized and enhances flexibility in a device layout.

In particular, in the case of integrating the plurality of p-type lateral high breakdown voltage MOSFETs and the n-type lateral high breakdown voltage MOSFETs, the enhanced flexibility in the device layout offers a great merit.

In the above-described example, an example is provided in which an absolute maximum rated voltage between the source and the drain is 80V. When the absolute maximum rated voltage between the source and the drain is 50V, the film thickness of the gate oxide film 107 can be established to such a thickness that the electric field value of the absolute maximum rated voltage between the source and the drain becomes equal to or less than 4 MV/cm depending on the absolute rated maximum voltage, for example, of 150 nm.

Figure 3:
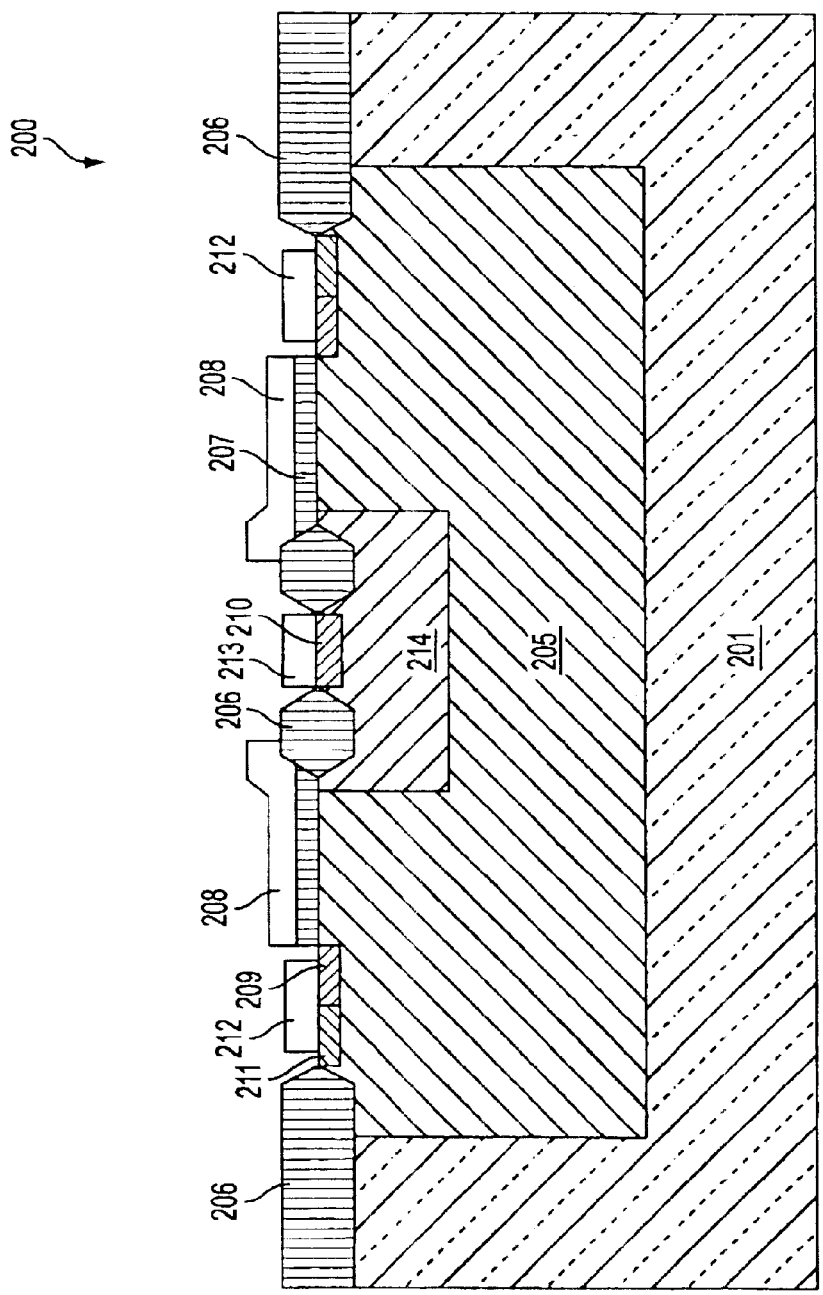
FIG. 3 illustrates a cross sectional view showing a second aspect of the present invention.

FIG. 3 is a cross sectional view of a p-type lateral high breakdown voltage MOSFET 200, in accordance with a second aspect of the present invention. The p-type lateral high breakdown voltage MOSFET 200 has an n-well layer 205 formed by diffusion in a desired region of a p-type semiconductor substrate 201 from a surface of the semiconductor substrate 201, and a p-type drain diffused layer 214 formed by diffusion from a surface side in the n-well layer 705. In the n-well layer 205, a p-type source diffused layer 209 is formed by diffusion from another side of the substrate surface in a region apart by a specified distance from a boundary of the drain diffused layer 214. In the drain diffused layer 214, a p-type drain contact layer 210 is formed from the side of the substrate surface in the central region at an approximately equal distance from the boundary of the n-well layer 205.

Moreover, on the surface of the n-well layer 205, a gate oxide film 207 is formed from an end of the source diffused layer 209 over a part of the drain diffused layer 214. Furthermore, on the surface of the drain diffused layer 214, in a region without the drain contact layer 210 and the gate oxide film 207 being formed, a field oxide film 206 is formed.

A gate electrode 208 is formed above the gate oxide film 207 so as to project a part of the field oxide film 206. On the source diffused layer 209 and on the drain contact layer 210, a source electrode 212 and a drain electrode 213 are formed, respectively.

Here, a distance between the source diffused layer 209 and the drain diffused layer 214 is longer than a projected length of the drain diffused layer 214 from the drain contact layer 210 towards the source diffused layer 209. Moreover, the film thickness of the gate oxide film 207 is formed to such a thickness in which an electric field value to an absolute maximum rated voltage between the source and the drain becomes equal to or less than 4 MV/cm. The reference numeral 211 denotes an n+ contact layer to the n-well layer 205.

For illustrative purposes, the film thickness of the gate oxide film is 250 nm and the film thickness of the field oxide film 206 is 800 nm. In particular, the width of the field oxide film 206 formed between the source and the drain is 2 mm. Moreover, the n-well layer 205 is diffused down to a depth of about 5 mm and the drain diffused layer 214 is diffused down to a depth of about 6 mm. The drain diffused layer 214 has a sheet resistance of 4 kΩ/o and a total amount of p-type impurities of $3.0 \times 10^{12}/cm^2$. The distance between the source diffused layer 209 and the drain diffused layer 214 (a channel length) is about 5 mm and the projection of the gate electrode 208 onto the field oxide film 206 is in the order of 1 mm. The breakdown voltage of the lateral high breakdown voltage MOSFET 200 is in the order of 110V and the absolute maximum rated voltage thereof is 80V.

Figure 4:
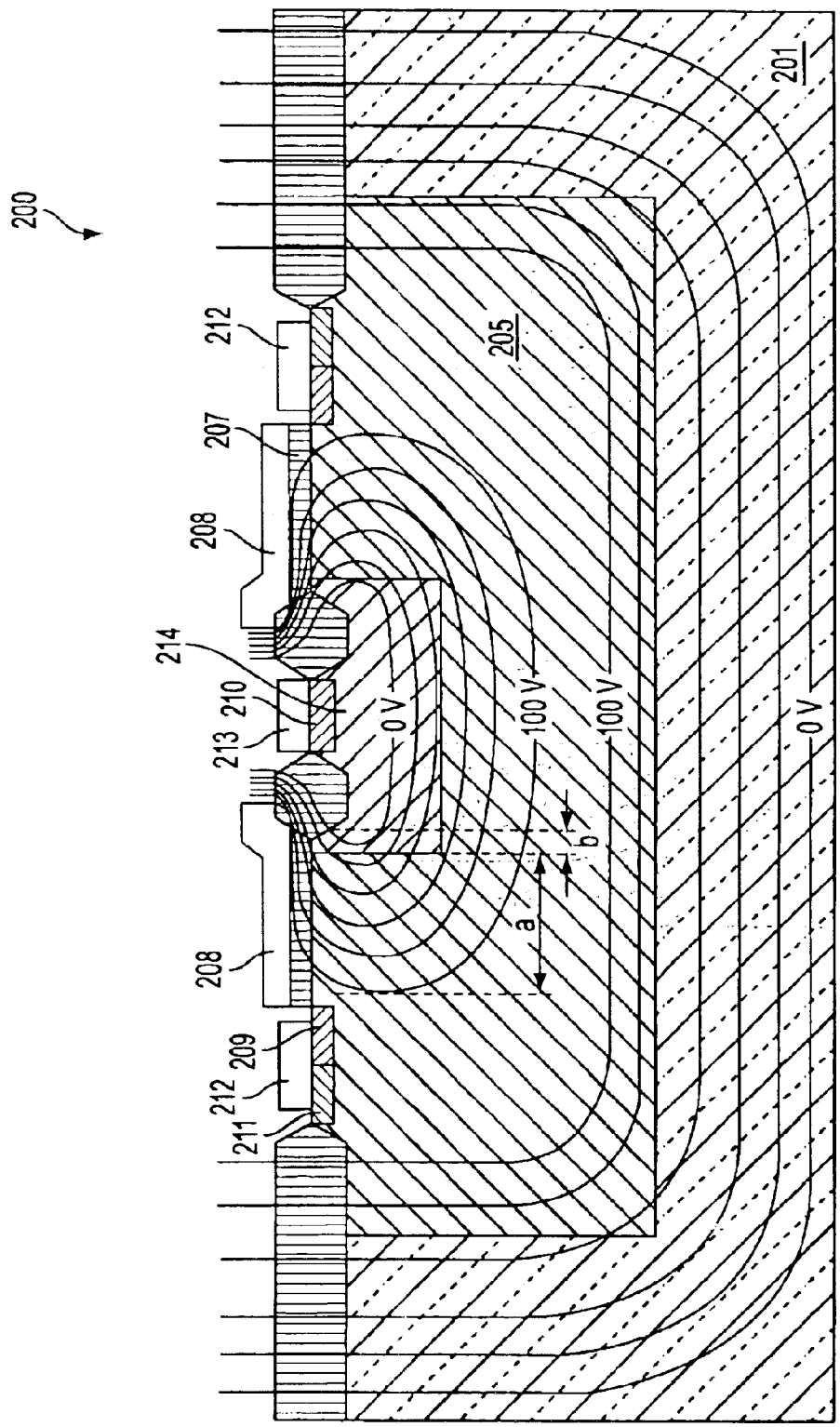
FIG. 4 illustrates a view showing equipotential lines in the second aspect of the present invention.

FIG. 4 is a view showing equipotential lines (20V interval) in a state in which a voltage of 0V is applied to the source electrode 212 and the gate 208, and 100V to the drain electrode 213, with the lateral high breakdown voltage MOSFET 200 being turned off. A depletion layer expands on both sides from a pn junction between the p-type drain diffused layer 214 and the n-well layer 205. In FIG. 4, the equipotential lines of 0V and 100V are approximately equal to respective ends of the depletion layer. When the voltage of 0V is applied to the substrate 201, the depletion layer expands also to a pn junction between the substrate 201 and the n-well layer 205.

Typically, in a vicinity of the surface of the silicon, the expansion of the depletion layer extending from the above-described pn junction is presented in which a width of the depletion layer extending into the n-well layer 205 (the distance indicated by "a" in FIG. 4) becomes wider than a width of the depletion layer extending into the drain diffused layer 214 (a distance indicated by "b" in FIG. 4). That is, the depletion layer expands mainly toward the n-well layer 205 side. Thus, most of the reverse-bias voltage between the source and the drain being turned off, is carried by the n-well layer 205.

As explained above, the distance between the source diffused layer 209 and the drain diffused layer 214 (the channel length) is formed longer than a projected length of the drain diffused layer 214 from the drain contact layer 210 toward the source diffused layer 209. Therefore, even though the depletion layer extends into the n-well layer 205, no depletion layer reaches the source diffused layer 209 to cause a punch-through.

Moreover, as is apparent also from the equipotential lines shown in FIG. 4 passing through in the gate oxide film 207, a considerable portion of the voltage is carried by the gate oxide film 207.

In the second aspect of the present invention, the gate oxide film 207 is formed to have such a thickness that the electric field value to the absolute maximum rated voltage between the source and the drain becomes equal to or less than 4 MV/cm (for example, 250 nm). Therefore, even though all of the voltage between the source and the drain is carried by the gate oxide film 207, the electric field strength in the gate oxide film 207 is 3.2 MV/cm. This causes no breakage of the gate oxide film to ensure reliability.

By employing the above-described arrangement according to an aspect of the invention, the drain diffused layer 214 is made hard to be depleted to make the depletion layer extend toward the body diffused layer side. Thus, the projection of the drain diffused layer 214 toward the source side can be made short.

Here, by the gate electrode 208 projecting long onto the field oxide film 206, the depletion layer is made easy to extend toward the drain contact layer by a field plate effect. That is, the shortened projection of the drain diffused layer 214 toward the source side, brings an end of the depletion layer close to the drain contact layer 210 by the field plate effect. The depletion layer reaching the drain contact layer 210 enhances the electric field at the portion to cause reduction in a breakdown voltage.

To reduce a resistance of the drain diffused layer 214, the projection of the drain diffused layer 214 toward the source side can be shortened. However, simply shortened projection distance causes reduction in the breakdown voltage for the above-described reason.

Thus, it is suitable to shorten the projection of the drain diffused layer 214 toward the source side, and along with this, to shorten the projection of the gate electrode 208 onto the field oxide film 206 because the shortened projection of the gate electrode 208 suppresses the field plate effect.

With such an arrangement, the projection of the drain diffused layer toward the source side can be shortened to provide a low resistance in the drain diffused layer 214, which is also effective to reduce a device pitch.

In the second aspect of the present invention, the projection of the gate electrode 208 onto the field oxide film 206 is established as being in the order of 1 mm to suppress an extension of the depletion layer into the drain diffused layer 214. A drift length of the drain diffused region 214 (a length of the projection from the drain contact layer 210) is so short as being in the order of 3 mm so that the resistance of the drain diffused layer 214 can be reduced.

Thus, the second aspect of the present invention can be made to have a total amount of impurities in the drain diffused layer 214 three times to thereby make a sheet resistance as being ⅓ compared with those of the conventional MOSFET. Furthermore, the drift length also becomes ½. Most of the on-resistance component (of the order of 90%) in the lateral high breakdown voltage MOSFET is occupied by drain resistance. The drain resistance can be brought to ⅙.

Moreover, a distance between the source diffused layer 209 and the drain diffused layer 214 (the channel length), being formed longer (on the order of 5 mm) than a projected length of the drain diffused layer 214 from the drain contact layer 210 toward the source diffused layer 209, becomes ⅝ times compared with about 3 mm of that of the conventional MOSFET. However, a proportion of the channel resistance occupying in the on-resistance is on the order of 10%. Thus, a sum of the drain resistance (on the order of 90% of the on-resistance) and the channel resistance (on the order of 10% of the same) is given as shown in the expression (2):

$$90\% \times (\tfrac{1}{6}) + 10\% \times (\tfrac{3}{5}) \approx 32\%, \quad (2)$$

which is reduced to an order of ⅓ compared to the conventional MOSFET. Furthermore, a length of the channel length and the length of the drift region is also somewhat shortened to 8 μm compared with a conventional 9 μm.

That is, the p-type lateral high breakdown voltage MOSFET with equal on-resistance to that of the conventional MOSFET can be formed with a channel width (a length in the perpendicular direction to the sheet of FIG. 3) of ⅓ to that of the conventional one. Furthermore, along with a reduction in a device pitch due to reduction in the length as the channel length and the length of the drift region, the device area can be reduced down to ⅓ or less.

Incidentally, a thickened gate oxide film raises a threshold voltage to reduce mutual conductance (Gm). However, the thickened gate oxide film provides sufficient drivability when a gate driving voltage of the p-type lateral high breakdown voltage MOSFET is as high as a drain voltage.

With respect to a case of forming an integrated circuit device (IC) by integrating a plurality of p-type lateral high breakdown voltage MOSFETs, an area of each individual lateral high breakdown voltage p MOSFET becomes ⅓ or less, which allows considerable downsizing of the integrated circuit device.

Furthermore, in the case of forming the integrated circuit device by integrating the p-type lateral high breakdown voltage MOSFET together with the n-type lateral high breakdown voltage MOSFET, a driving circuit for the high breakdown voltage devices, other peripheral circuits, and the like, the area of the p-type lateral high breakdown voltage p MOSFET previously having occupied a large area becomes ⅓ or less, which allows the integrated circuit device to be downsized and enhances flexibility in a device layout.

In particular, in the case of integrating the plurality of p-type lateral high breakdown voltage MOSFETs and n-type lateral high breakdown voltage MOSFETs, the enhanced flexibility in the device layout offers a great merit.

In the above-described example, the explanation is presented of an example in which an absolute maximum rated voltage between the source and the drain is taken as 80V. When the absolute maximum rated voltage between the source and the drain is taken as 50V, the film thickness of the gate oxide film 207 can be established to such a thickness that the electric field value of the breakdown voltage between the source and the drain becomes equal to or less than 4 MV/cm depending on the absolute rated maximum voltage of, for example, 150 nm.

Figure 5:
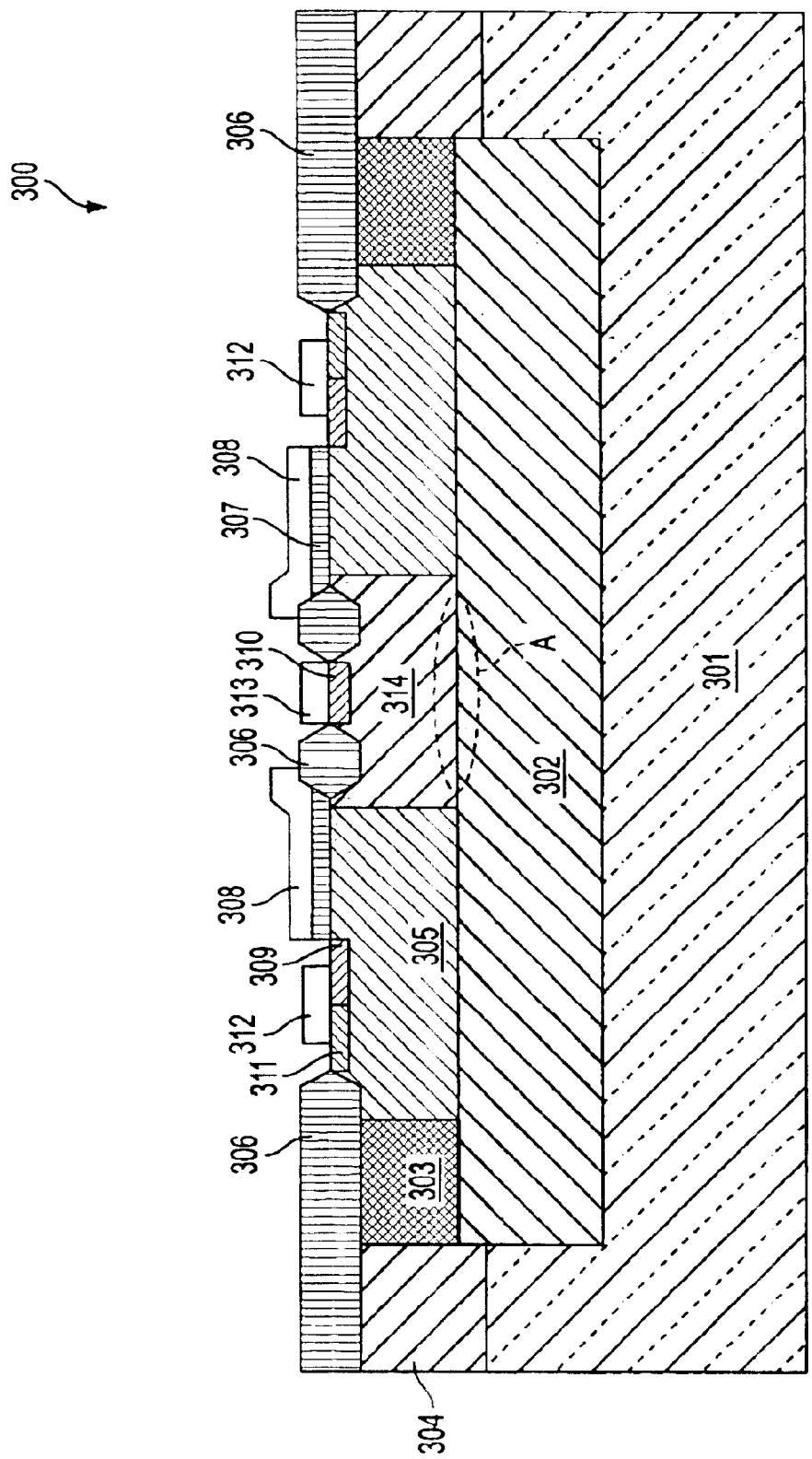
FIG. 5 illustrates a cross sectional view showing a third aspect of the present invention.

FIG. 5 is a cross sectional view of a p-type lateral high breakdown voltage MOSFET 300 as a third aspect in accordance with the present invention. The p-type lateral high breakdown voltage MOSFET 300 is formed with an n-type buried layer 302 in a desired region of a p-type semiconductor substrate 301, and has a p-type drain diffused layer 314 formed by diffusion from a surface side of an epitaxial layer (not illustrated) formed on the n-type buried layer 302. An n-well layer 305 is formed by diffusion from a surface side so as to surround the outer periphery (side face) of the drain diffused layer 314, and an n+ wall layer 303 is formed by diffusion so as to surround an outer periphery of the n-well layer 305. A side face of the drain diffused layer 314 is in contact with the n-well layer 305.

The n-well layer 305 and the drain diffused layer 314 are formed by selectively injecting impurities with desired doses in a forming region of the n-well layer 305 and a forming region of the drain diffused layer 314, respectively, before the injected impurities are simultaneously diffused.

In the n-well layer 305, a p-type source diffused layer 309 is formed from the side of the substrate surface in a region apart by a specified distance from a boundary with the drain diffused layer 314. In the drain diffused layer 314, a p-type drain contact layer 310 is formed from the side of the substrate surface in the central region at an approximately equal distance from the boundary with the n-well layer 305. The drain diffused layer 314, the n-well layer 305, and the n+ wall layer 303 are diffused down to depths reaching the buried layer 314. With respect to the n+ wall layer 303, selectively impurities may be injected with desired doses in a forming region of the n+ wall layer 303 to carry out simultaneous diffusion and formation in the diffusion process for the n-well layer 305 and the drain diffused layer 314.

On the outside of the n+ wall layer 303, a p-well layer 304 is formed to electrically isolate the p-type lateral high breakdown voltage MOSFET 300 from the p-type semiconductor substrate 301. The p-well layer 304 can be formed simultaneously with the formation of the drain diffused layer 314.

Moreover, on the surface of the n-well layer 305, a gate oxide film 307 is formed from an end of the source diffused layer 309 over a part of the drain diffused layer 314. Of the surface of the drain diffused layer 314, in a region without the drain contact layer 310 and the gate oxide film 307 being formed, a field oxide film 306 is formed.

A gate electrode 308 is formed from above the gate oxide film 307 so as to project a part of the field oxide film 306. On the source diffused layer 309 and on the drain contact layer 310, a source electrode 312 and a drain electrode 313 are formed, respectively.

As described above, by providing the n-type buried layer 302 and the n+ wall layer 303, a current leaking from the element region to the substrate 301 can be reduced.

Here, a distance between the source diffused layer 309 and the drain diffused layer 314 is formed longer than a projected length of the drain diffused layer 314 from the drain contact layer 310 toward the source diffused layer 309. Moreover, the film thickness of the gate oxide film 307 is formed to a thickness in which an electric field value to an absolute maximum rated voltage between the source and the drain becomes equal to or less than 4 MV/cm. The reference numeral 311 denotes an n+ contact layer to the n-well layer 305.

For illustrative purposes, the film thickness of the gate oxide film 307 is 250 nm and the film thickness of the field oxide film 306 is 800 nm. In particular, the width of the field oxide film 306 formed between the source and the drain is 2 mm. Moreover, the drain diffused layer 314, the n-well layer 305, and the n+ wall layer 303 are diffused down to depths reaching the n-type buried layer 302 formed to a depth of about 6 mm from a surface of the substrate 301. The drain diffused layer 314 has a sheet resistance of 4 kΩ/o and a total amount of p-type impurities of $3.0 \times 10^{12}/\text{cm}^2$. A distance between the source diffused layer 309 and the drain diffused layer 314 (a channel length) is about 5 mm and a projection of the gate electrode 308 onto the field oxide film 306 is on the order of 1 mm. The breakdown voltage of the p-type lateral high breakdown voltage MOSFET 300 is in the order of 105V and the absolute maximum rated voltage thereof is 80V.

Figure 6:
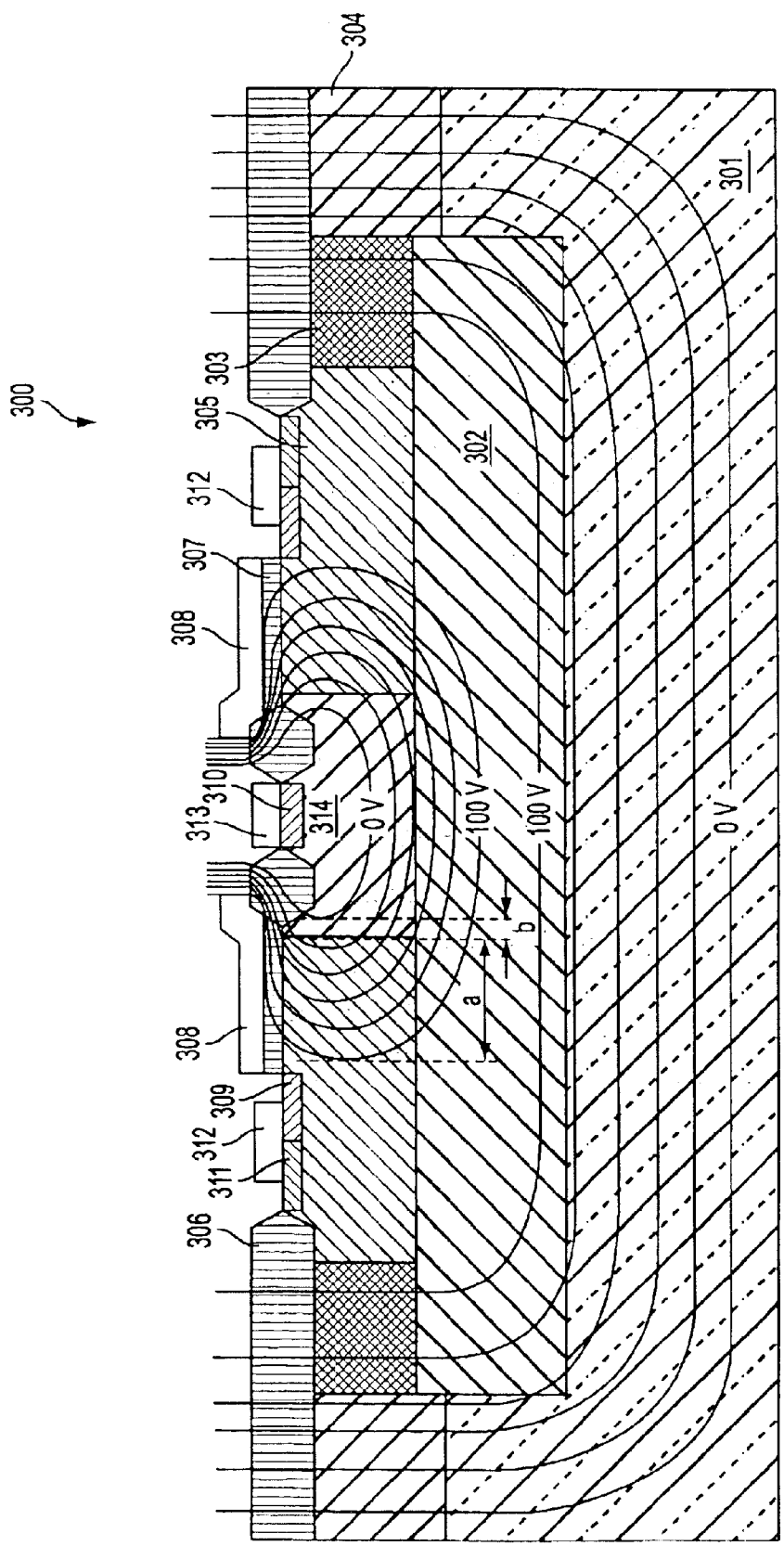
FIG. 6 illustrates a view showing equipotential lines in the third aspect of the present invention.

FIG. 6 is a view showing equipotential lines (20V interval) in a state in which a voltage of 0V is applied to the source electrode 312 and the gate 308, and 100V to the drain electrode 313, with the p-type lateral high breakdown voltage MOSFET 300 being turned off. A depletion layer expands on both sides from pn junctions between the p-type drain diffused layer 314 and the n-well layer 305, and the p-type drain diffused layer 314 and the n buried layer 302. In FIG. 6, the equipotential lines of 0V and 100V are approximately equal to respective ends of the depletion layer. Furthermore, when the p-type semiconductor substrate 301 is held at 0V, as shown in FIG. 6, the depletion layer extends also to a pn junction between the p-type semiconductor substrate 301 and the n-well layer 302.

In a vicinity of the surface of the silicon, an expansion of the depletion layer extending from the pn junction is a width of the depletion layer extending into the n-well layer 305 (a distance indicated by "a" in FIG. 6) becomes wider than a width of the depletion layer extending into the drain diffused layer 304 (a distance similarly indicated by "b"). That is, the depletion layer expands mainly toward the n-well layer 305 side. Thus, most of the reverse-bias voltage between the source and the drain at turned off is carried by the n-well layer 305.

As explained above, the distance between the source diffused layer 309 and the drain diffused layer 314 (the channel length) is longer than a projected length of the drain diffused layer 314 from the drain contact layer 310 toward the source diffused layer 309. Therefore, even though the depletion layer extends into the n-well layer 305, no depletion layer reaches the source diffused layer 309 to cause no punch-through.

Moreover, as is apparent also from the equipotential lines shown in FIG. 6 passing through in the gate oxide film 307, a considerable portion of the voltage is carried by the gate oxide film 307.

In a third aspect according to the present invention, the gate oxide film 307 is formed to have such a thickness that an electric field value to an absolute maximum rated voltage between the source and the drain becomes equal to or less than 4 MV/cm (for example, 250 nm). Therefore, even though all of the voltage between the source and the drain (100V) is carried by the gate oxide film 307, the electric field strength in the gate oxide film is 3.2 MV/cm, which causes no breakage of the gate oxide film 307 to ensure reliability.

By employing the above-described arrangement according to an aspect of the invention, the drain diffused layer 314 is made hard to be depleted to make the depletion layer extend toward a body diffused layer side. Thus, a projection of the drain diffused layer 314 toward the source side can be made short.

Here, by the gate electrode 308 projecting long onto the field oxide film, the depletion layer is made easy to extend toward the drain contact layer 310 by a field plate effect. That is, the shortened projection of the drain diffused layer 314 toward the source side brings an end of the depletion layer close to the drain contact layer 310 by the field plate effect. The depletion layer reaching the drain contact layer 310 enhances the electric field at a portion to cause reduction in the breakdown voltage.

To reduce a resistance of the drain diffused layer 314, the projection of the drain diffused layer 314 toward the source side can be shortened. However, simply shortened projection distance causes reduction in the breakdown voltage for the above-described reason.

Thus, it is suitable to shorten the projection of the drain diffused layer 314 toward the source side, and along with this, to shorten the projection of the gate electrode 308 onto the field oxide film 306 because the shortened projection of the gate electrode suppresses the field plate effect.

With such an arrangement, the projection of the drain diffused layer toward the source side can be shortened to provide a low resistance in the drain diffused layer 314, which is also effective to reduce the device pitch.

In the third aspect according to the present invention, the projection of the gate electrode 308 onto the field oxide film 306 is established as being in the order of 1 mm to suppress an extension of the depletion layer into the drain diffused layer 314. A drift length of the drain diffused region 314 (a length of the projection from the drain contact layer) is so short as being in the order of 3 mm so that the resistance of the drain diffused layer 314 can be reduced.

Thus, the third aspect according to the present invention, can be made to have a total amount of impurities in the drain diffused layer 314 three times to thereby make the sheet resistance as being ⅓ compared with those of the conventional MOSFET. Furthermore, the drift length also becomes ½. Most of the on-resistance component (of the order of 90%) in the lateral high breakdown voltage MOSFET is occupied by drain resistance. The drain resistance can be brought to ⅙.

Moreover, a distance between the source diffused layer 309 and the drain diffused layer 314 (the channel length), being formed longer (on the order of 5 mm) than a projected length of the drain diffused layer 314 from the drain contact layer 310 toward the source diffused layer 309, becomes ⅝ times compared with about 3 mm of that of the conventional MOSFET. However, a proportion of the channel resistance occupying in the on-resistance is on the order of 10%. Thus, a sum of the drain resistance (on the order of 90% of the on-resistance) and the channel resistance (on the order of 10% of the same) is given as shown in the expression (3):

$$90\% \times (\tfrac{1}{6}) + 10\% \times (\tfrac{3}{5}) \approx 32\%, \quad (3)$$

which is reduced to an order compared to the ⅓ of conventional MOSFET. Furthermore, a length of the channel length and the length of the drift region is also somewhat shortened 8 μm compared with a conventional 9 μm.

That is, the p-type lateral high breakdown voltage MOSFET with equal on-resistance to that of the conventional MOSFET can be formed with a channel width (a length in the perpendicular direction to the sheet of FIG. 5) of ⅓ to that of the conventional one. Furthermore, along with a reduction in a device pitch due to reduction in the length as the channel length and the length of the drift region, the device area can be reduced down to ⅓ or less.

In the third aspect according to the present invention, the drain diffused layer 314 is diffused down to a depth reaching the n-type buried layer 302. Accordingly, a breakdown point when a reverse-bias is applied between the source and the drain in a state that the MOSFET 300 is turned off can be positioned at the boundary portion between the drain diffused layer 314 and the n-type buried layer 302. That is, the breakdown point can be positioned at a portion deep from the surface of the device (a region A surrounded by a dotted line in FIG. 5: inside of a bulk). Hence, there is no danger that hot carriers may be injected into the surface oxide film at breakdown. This can prevent variation in a breakdown voltage of the device accompanied with entrance of hot carriers into the surface oxide film to enhance reliability of the device.

Incidentally, a thickened gate oxide film raises a threshold voltage to reduce mutual conductance (Gm) which, however, provides sufficient drivability when a gate driving voltage of the p-type lateral high breakdown voltage MOSFET is as high as a drain voltage like in such a case that the MOSFET is applied to the PDP driver IC.

With respect to a case of forming the integrated circuit device (IC) by integrating the plurality of p-type lateral high breakdown voltage MOSFETs, the area of each individual p-type lateral high breakdown voltage MOSFET becomes ⅓ or less, which enables considerable downsizing of the integrated circuit device.

Furthermore, in the case of forming the integrated circuit device by integrating the p-type lateral high breakdown voltage MOSFET together with the n-type lateral high breakdown voltage MOSFET, a driving circuit for the high breakdown voltage devices, other peripheral circuits, and the like, the area of the p-type lateral high breakdown voltage MOSFET previously having occupied a large area becomes ⅓ or less, which allows the integrated circuit device to be downsized and enhances flexibility in a device layout.

In particular, in the case of integrating the plurality of p-type lateral high breakdown voltage MOSFETs and n-type lateral high breakdown voltage MOSFETs, the enhanced flexibility in the device layout offers a great merit.

In the above-described example, the explanation is presented of an example in which an absolute maximum rated voltage between the source and the drain is taken as 80V. When the absolute maximum rated voltage between the source and the drain is taken as 50V, the film thickness of the gate oxide film 307 can be established to such a thickness that the electric field value of the absolute maximum rated voltage between the source and the drain becomes equal to or less than 4 MV/cm depending on the absolute rated maximum voltage of, for example, 150 nm.

Figure 7:
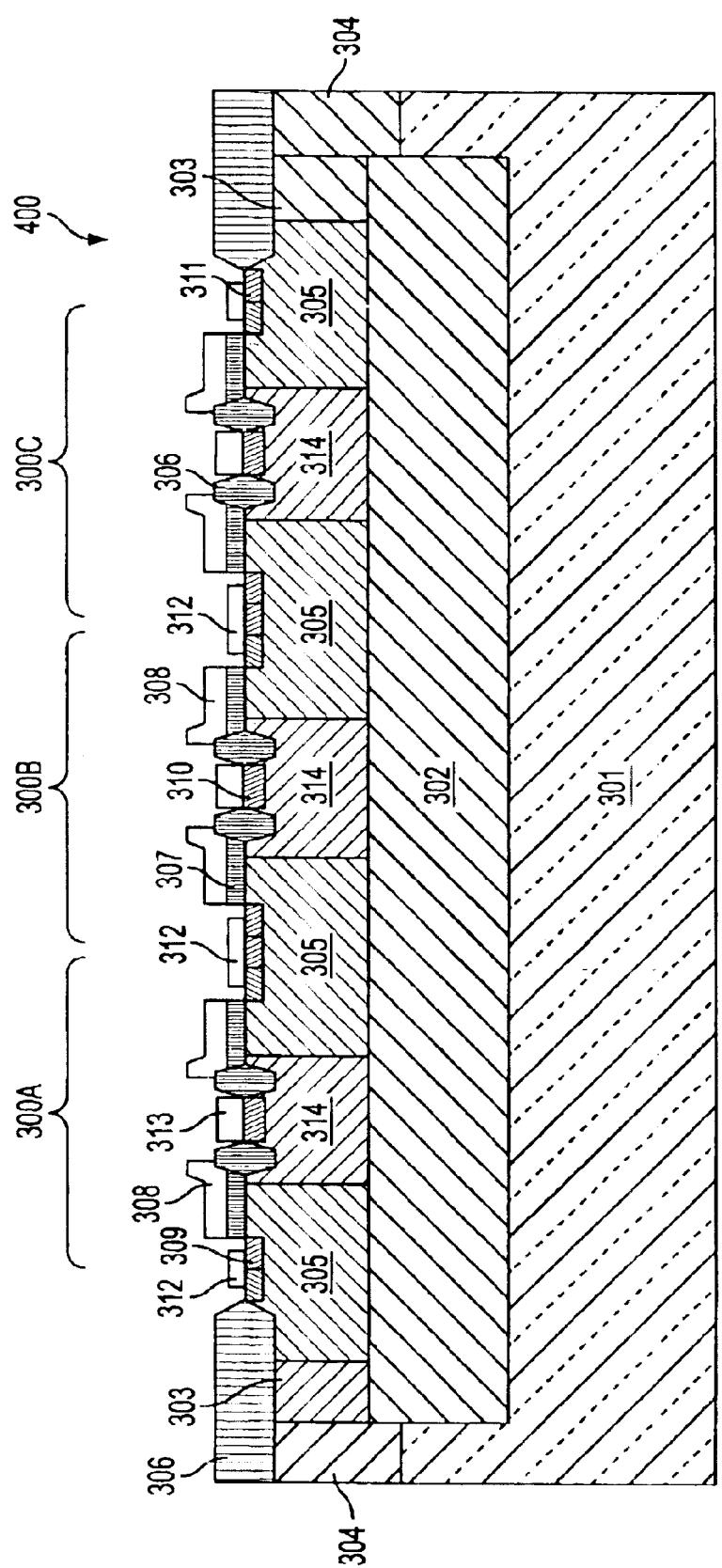
FIG. 7 illustrates a cross sectional view showing a fourth aspect of the present invention.

FIG. 7 is a cross sectional view of a p-type lateral high breakdown voltage MOSFET 400 as a fourth aspect according with the present invention. The fourth aspect is an example in which the arrangement of the p-type lateral high breakdown voltage MOSFET 300 explained as the third aspect is applied to a driver IC of a PDP or the like. In FIG. 7, because of a restriction on a size of the drawing, there is shown an example of disposing three lateral high breakdown voltage MOSFETs 300 in parallel. As described before, the driver IC has a number of outputs. Therefore, when used for an actual driver IC, several tens or more (for example, 128) of the p-type lateral high breakdown voltage MOSFETs 300 are disposed in parallel to be used in output stages for respective output bits thereof. That is, the drain electrodes of the lateral high breakdown voltage MOSFETs 300 are connected to output terminals not shown in FIG. 7.

In FIG. 7, the same arrangement as that in FIG. 5 is designated by the same reference numerals with explanation thereof omitted. In FIG. 7, there is shown a state in which three lateral high breakdown voltage MOSFETs of lateral high breakdown voltage MOSFETs 300A to 300C are disposed in parallel. At this time, the n+ wall layer 303 is disposed at the outermost periphery of a structure in which the lateral high breakdown voltage MOSFETs 300A to 300C are disposed in parallel rather than between the neighboring lateral high breakdown voltage MOSFETs 300 because the n-well layers 305 are diffused down to a depth reaching the buried layer 302 (about 6 mm), so that device isolation between the respective lateral high breakdown voltage MOSFETs 300 disposed in parallel is made by each of the n-well layers 305.

Figure 13:
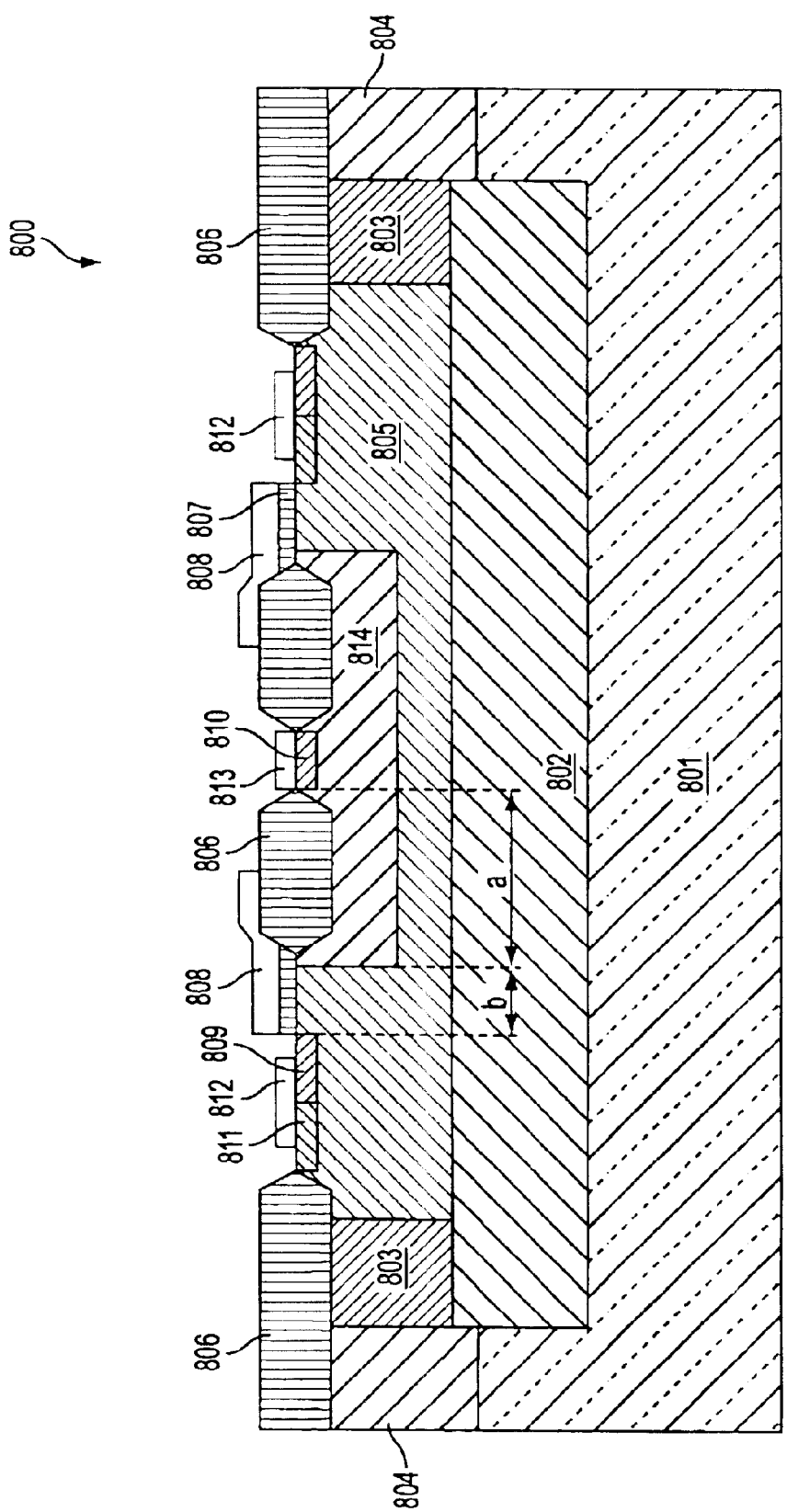
FIG. 13 illustrates a cross sectional view showing a third example of a conventional MOSFET.
Figure 14:
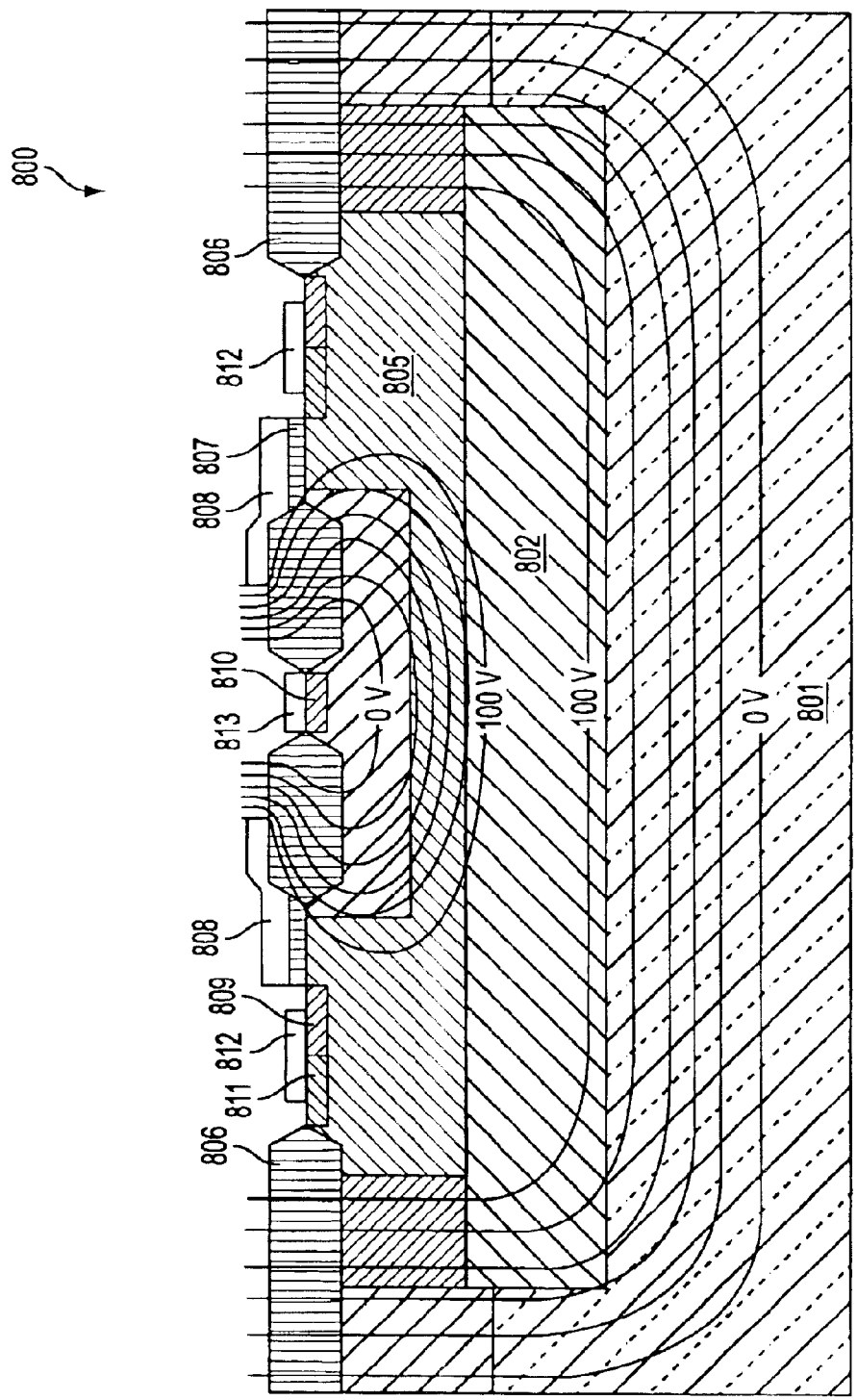
FIG. 14 illustrates a view showing equipotential lines in the third example of a conventional MOSFET.

In the third example of a conventional MOSFET shown in FIG. 13, to dispose the lateral high breakdown voltage MOSFETs 800 in parallel, it is necessary to provide the n+ wall layers between the respective lateral high breakdown voltage MOSFETs 800. In the example explained in FIG. 7, device isolation between the MOSFETs 800 disposed in parallel is made by the n-well layer 305, so that the n+ wall layers between the devices disposed in parallel becomes unnecessary.

Consequently, areas for device isolation regions are reduced. When the MOSFETs 800 are applied to such a device as the PDP driver IC having several tens or more of output bits, to reduce areas for device isolation regions is to reduce the device area of the IC, which is effective for reduction in cost of the IC.

Figure 8:
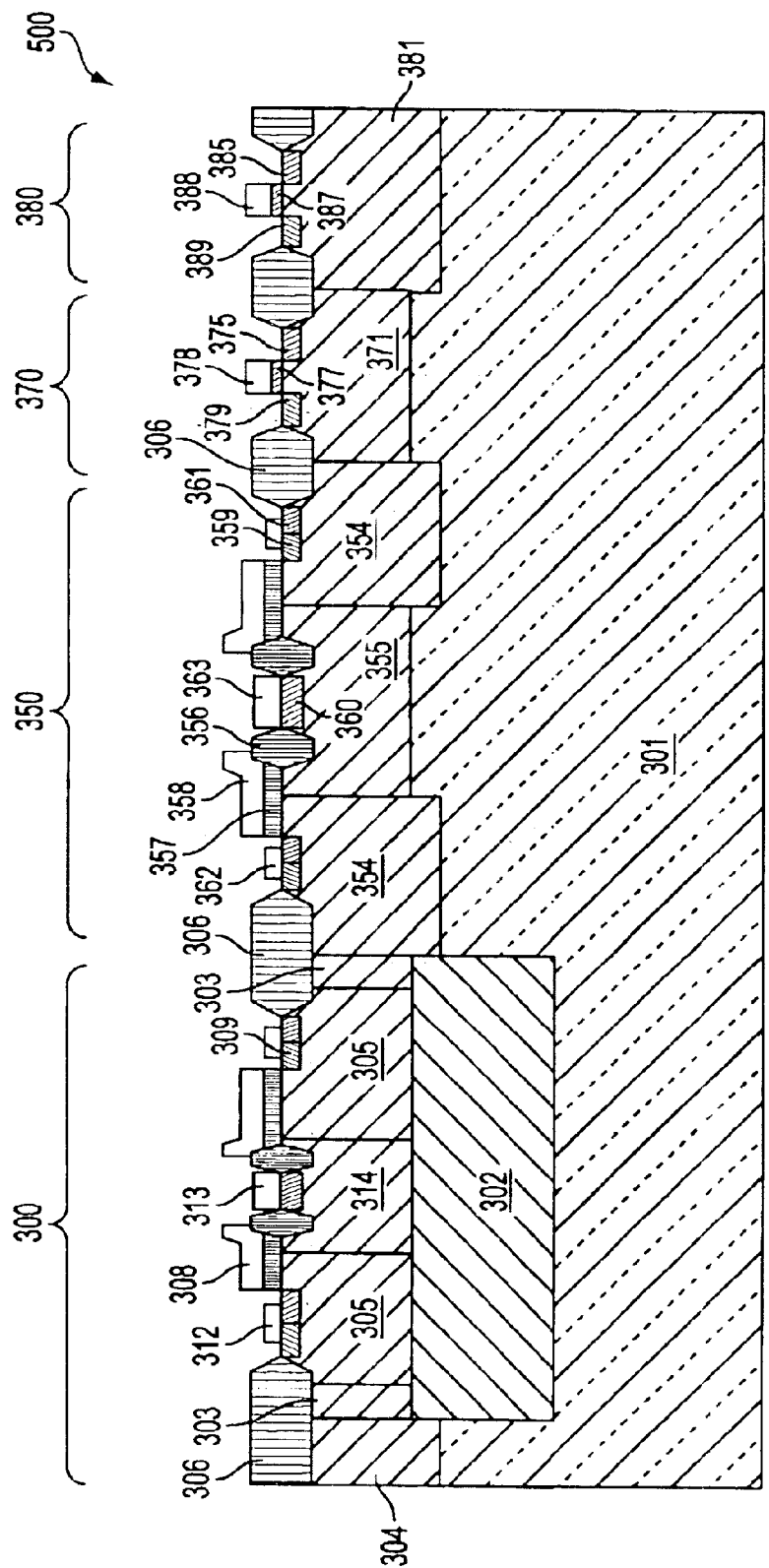
FIG. 8 illustrates a cross sectional view showing a fifth aspect of the present invention.
Figure 9:
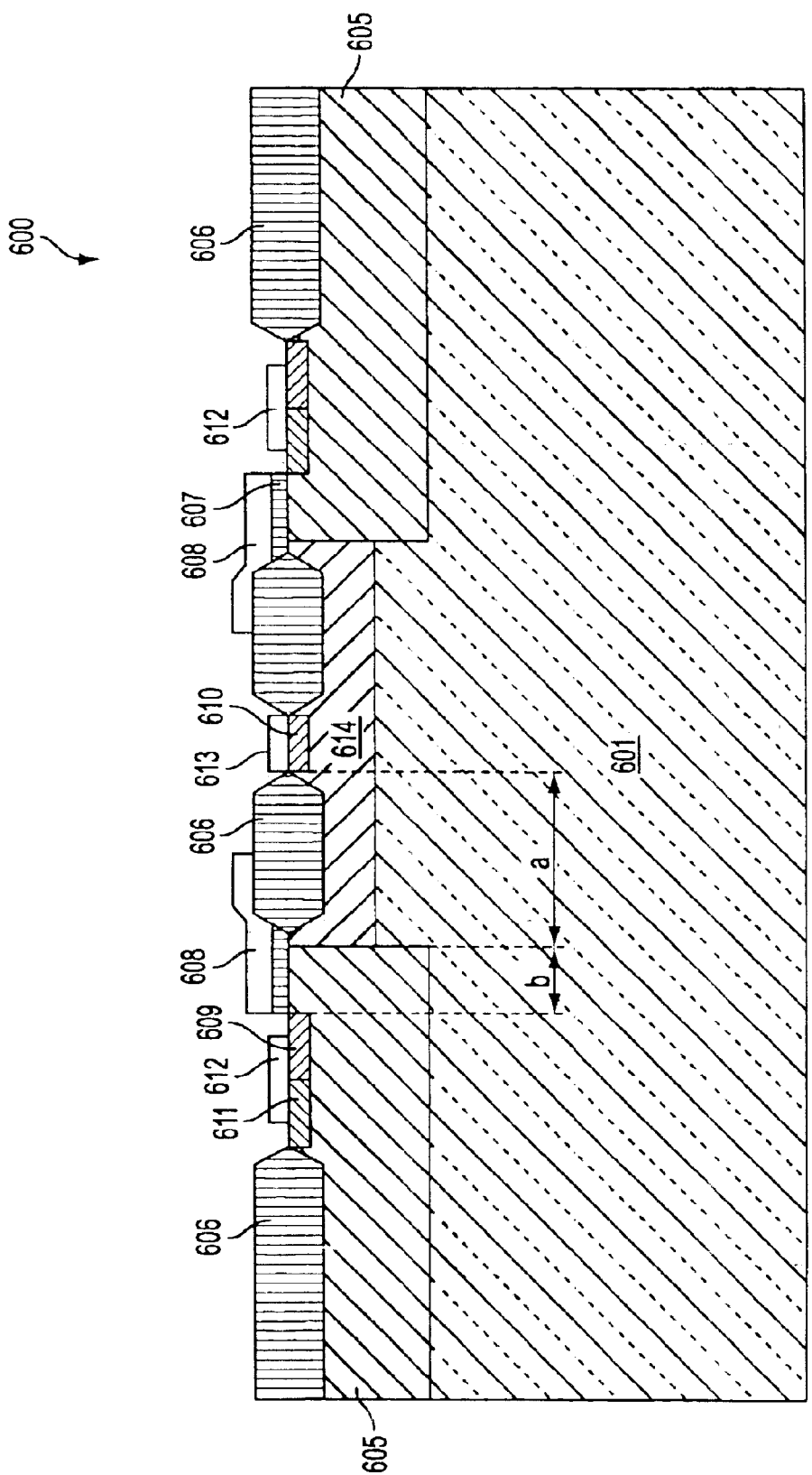
FIG. 9 illustrates a cross sectional view showing a first example of a conventional MOSFET.
Figure 10:
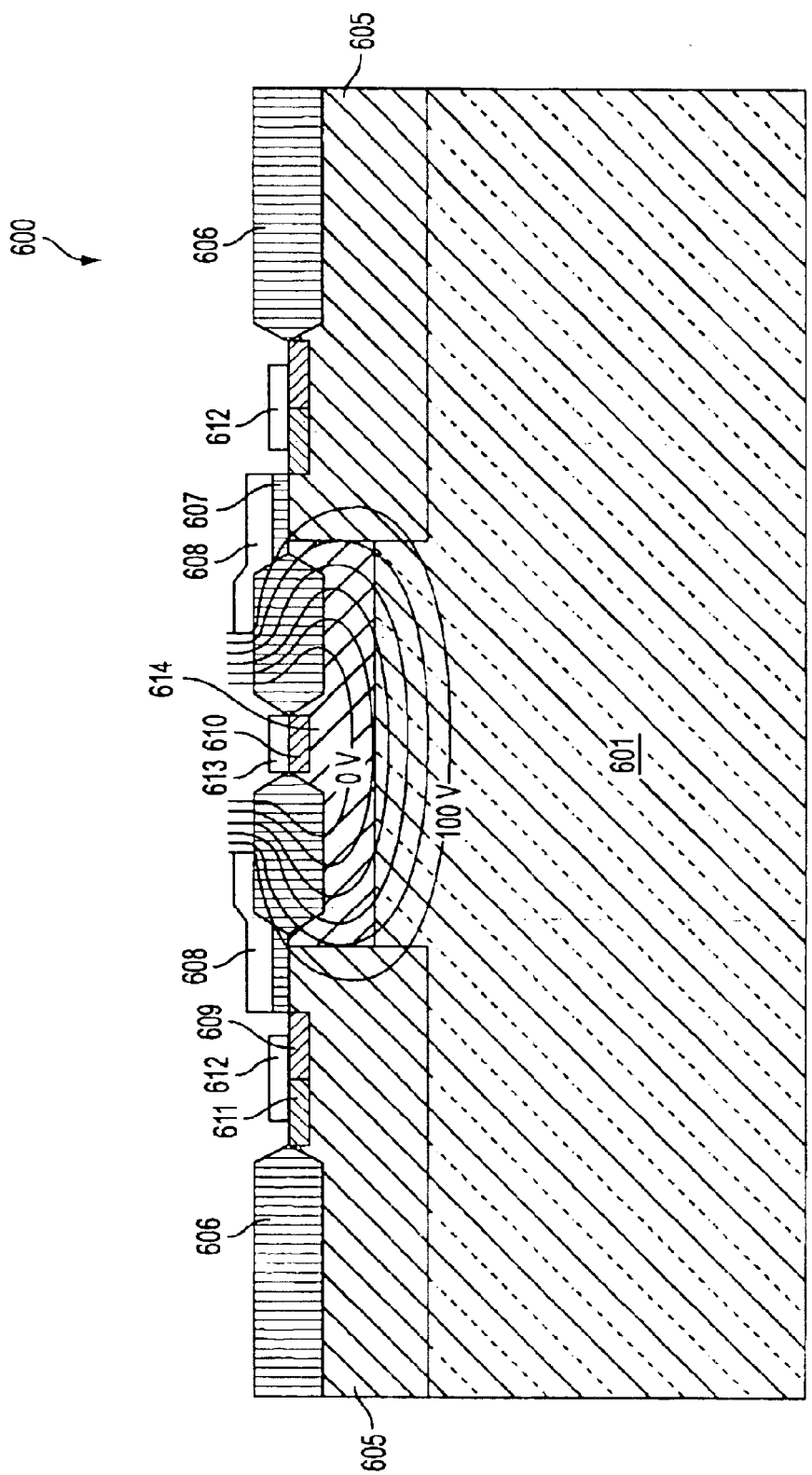
FIG. 10 illustrates a view showing equipotential lines in the first example of a conventional MOSFET.
Figure 11:
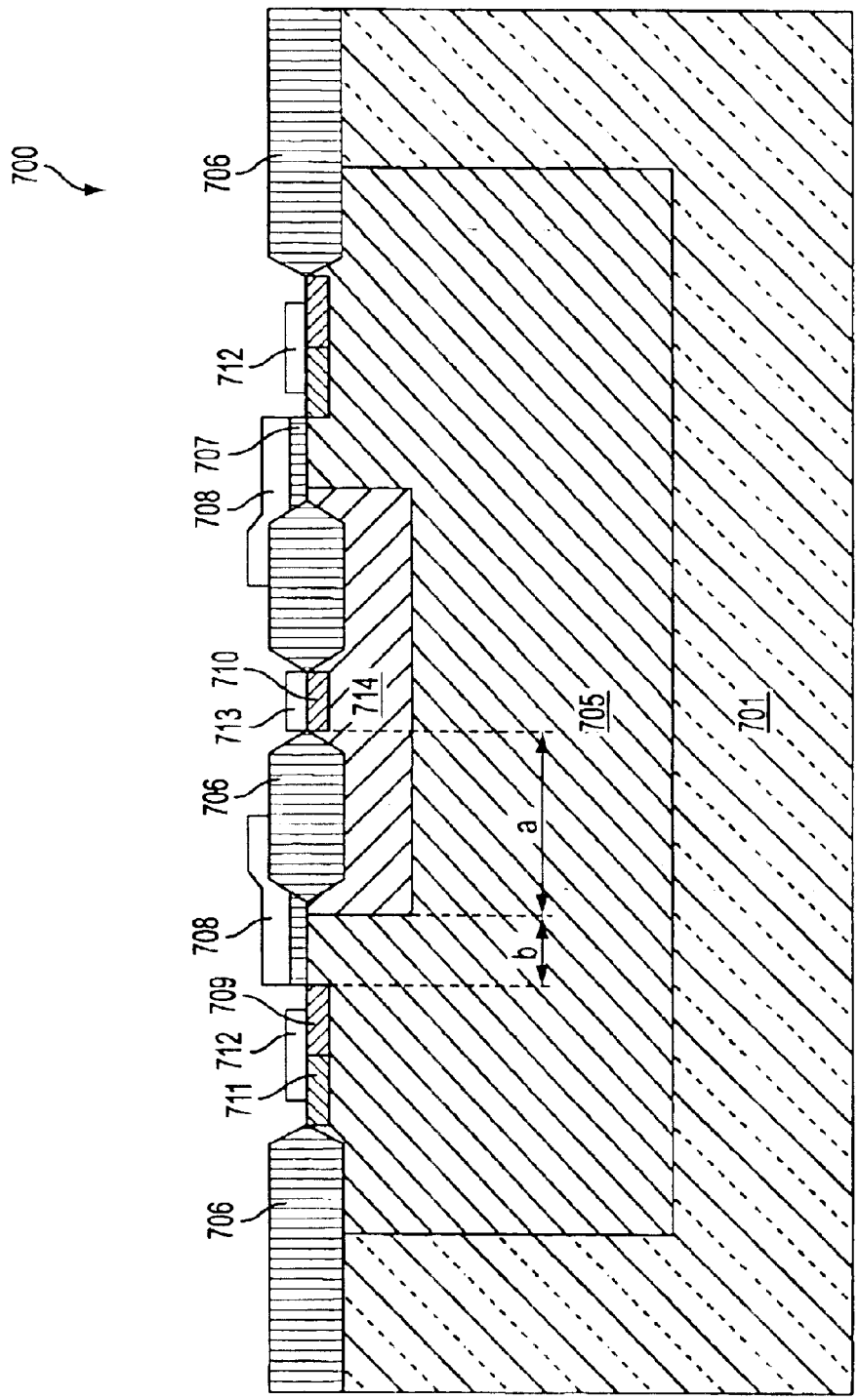
FIG. 11 illustrates a cross sectional view showing a second example of a conventional MOSFET.
Figure 12:
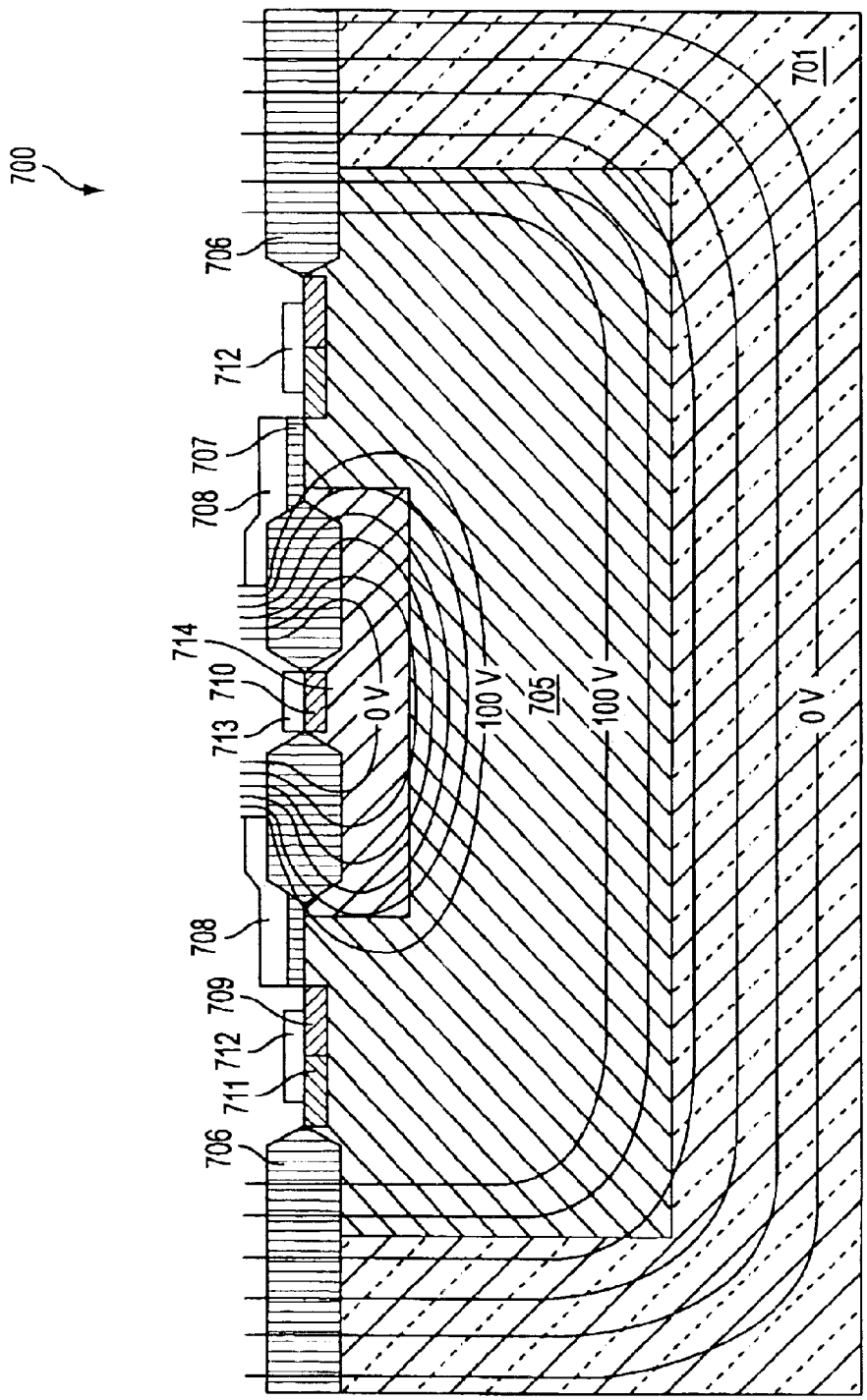
FIG. 12 illustrates a view showing equipotential lines in the second example of a conventional MOSFET.

FIG. 8 is a cross sectional view of a semiconductor device 500 as a fifth aspect according to an aspect of the present invention. The fifth aspect is an example in which the p-type lateral high breakdown voltage MOSFET 300 explained in the above-described third aspect and an n-type lateral high breakdown voltage MOSFET 350 are disposed side by side, with low breakdown voltage MOSFETs 370 and 380 further disposed side by side.

In FIG. 8, the p-type lateral high breakdown voltage MOSFET 300 is designated by the same reference numerals as those in FIG. 5, with explanation thereof omitted.

The n-type lateral high breakdown voltage MOSFET 350 has a drain diffused layer 355 formed by diffusion in a desired region on the surface of the p-type semiconductor substrate 301, and a p-well layer 354 formed by diffusion so as to surround the outer periphery of the drain diffused layer 355. In the p-well layer 354, an n-type source diffused layer 359 is formed from the side of the substrate surface in a region apart by a specified distance from a boundary with the above-described drain diffused layer 355. In the drain diffused layer 355, an n-type drain contact layer 360 is formed from the side of the substrate surface in the central region at an approximately equal distance from the boundary with the p-well layer 354.

Moreover, on the surface of the p-well layer 354, a gate oxide film 357 is formed from an end of the source diffused layer 359 over a part of the drain diffused layer 355. Furthermore, of the surface of the drain diffused layer 355, in a region without the drain contact layer 360 and the gate oxide film 357 being formed, a field oxide film 356 is formed.

A gate electrode 358 is formed from above the gate oxide film 357 so as to project a part of the field oxide film 356. On the source diffused layer 359 and on the drain contact layer 360, a source electrode 362 and a drain electrode 363 are formed, respectively. The reference numeral 361 denotes a p+ contact layer to the p well layer 354.

As a specific example of the n-type lateral high breakdown voltage MOSFET 350, the film thickness of the gate oxide film 357 is 25 nm and the film thickness of the field oxide film 356 is 800 nm. In particular, the width of the field oxide film 356 formed between the source and the drain is 5 mm. Moreover, the drain diffused layer 355 and the p-well layer 354 are diffused down to a depth of about 7 mm from the surface.

Because a gate driving voltage of the n-type lateral high breakdown voltage MOSFET 350 is in the order of 5V, the film thickness of the gate oxide film 357 as much as 25 nm causes no problem in reliability and also provides sufficiently large mutual conductance (Gm).

The n-type lateral high breakdown voltage MOSFET 350 employs the RESURF structure, with the breakdown voltage being in the order of 105V like the p-type lateral high breakdown voltage MOSFET 300.

For the drain diffused layer 355 of the n-type lateral high breakdown voltage MOSFET 350, the drain diffused layer 355 can be used which is simultaneously formed with the n-well layer 305 of the p-type lateral high breakdown voltage MOSFET 300.

In an ion implantation process to form the n-well layer 305 of the p-type lateral high breakdown voltage MOSFET 300, ion implantation is carried out simultaneously also in a forming region of the drain diffused layer 355 of the n-type lateral high breakdown voltage MOSFET 350. With the diffusion process carried out subsequently, each of the diffused layers can be formed simultaneously.

That is, with a lithography process, an ion implantation process, and the diffusion process each may be carried out in one process step, and the n-well layer 305 of the p-type lateral high breakdown voltage MOSFET 300 and the drain diffused layer 355 of the n-type lateral high breakdown voltage MOSFET 350 can be formed simultaneously.

In the same way, the p-well layer 354 can use a diffused layer simultaneously formed with the drain diffused layer 314.

In an ion implantation process to form the drain diffused layer 314 of the p-type lateral high breakdown voltage MOSFET 300, ion implantation is carried out simultaneously also in a forming region of the p-well layer 354 of the n-type lateral high breakdown voltage MOSFET 350. With the diffusion process carried out subsequently, each of the diffused layers can be formed simultaneously.

That is, with the lithography process, the ion implantation process, and the diffusion process each carried out in one process step, the drain diffused layer 314 of the p-type lateral high breakdown voltage MOSFET 300 and the p-well layer 354 of the n-type lateral high breakdown voltage MOSFET 350 can be formed simultaneously.

Thus, the process of forming the diffused layers being used can be made common to the p-type lateral high breakdown voltage MOSFET and the n-type lateral high breakdown voltage MOSFET, which allows the p-type lateral high breakdown voltage MOSFET and the n-type lateral high breakdown voltage MOSFET to be formed on the same semiconductor substrate without increasing the number of process steps.

In addition, for being employed in the driver IC of PDP, a push-pull circuit can be formed with the p-type lateral high breakdown voltage MOSFET 300 and the n-type lateral high breakdown voltage MOSFET 350, both in the semiconductor device 500. The p-type and n-type lateral high breakdown voltage MOSFETs forming a plurality of push-pull circuits can be formed without increasing the number of process steps to effectively provide a low cost driver IC.

Furthermore, in each of the first to the fifth aspects according to the present invention having been explained previously, diffused layers can be formed simultaneously with the diffused layers (the n-well layers, the drain diffused layers, the p well layers etc.) of the lateral high breakdown voltage MOSFET to form a low breakdown voltage MOSFET in each of the diffused layer.

For example, as shown in FIG. 8, a diffused layer 371 is formed simultaneously with the formation of the drain diffused layer 355 of the n-type lateral high breakdown voltage MOSFET 350 and the like.

In the ion implantation process to form the n-well layer 305 of the p-type lateral high breakdown voltage MOSFET 300 and the drain diffused layer 355 of the n-type lateral high breakdown voltage MOSFET 350, ion implantation is carried out simultaneously also in a forming region of the diffused layer 371. With the diffusion process carried out subsequently, each of the diffused layers can be formed simultaneously.

That is, with the lithography process, an ion implantation process, and the diffusion process each carried out in one process step, the n-well layer 305 of the p-type lateral high breakdown voltage MOSFET 300, the drain diffused layer 355 of the n-type lateral high breakdown voltage MOSFET 350, and the diffused layer 371 can be formed simultaneously.

Then, with the diffused layer 371 taken as a well, there is formed a low breakdown voltage p-type MOSFET 370 including a source diffused layer 375, a drain diffused layer 379, a gate oxide film 377, and a gate electrode 378 (a source and drain electrodes are not illustrated).

In the same way, a diffused layer 381 is formed simultaneously with the formation of the p-well layer 354 and the like of the n-type lateral high breakdown voltage MOSFET 350.

In an ion implantation process to form the drain diffused layer 314 of the p-type lateral high breakdown voltage MOSFET 300 and the p-well layer 354 of the n-type lateral high breakdown voltage MOSFET 350, ion implantation is carried out simultaneously also in a forming region of the diffused layer 381. With the diffusion process carried out subsequently, each of the diffused layers can be formed simultaneously.

That is, with the lithography process, the ion implantation process, and the diffusion process each carried out in one process step, the drain diffused layer 314 of the p-type lateral high breakdown voltage MOSFET 300, the p-well layer 354 of the n-type lateral high breakdown voltage MOSFET 350, and the diffused layer 381 can be formed simultaneously.

Then, with the diffused layer 381 being considered, there is formed a low breakdown voltage n-type MOSFET 380 including a source diffused layer 385, a drain diffused layer 389, a gate oxide film 387, and a gate electrode 388 (a source and drain electrodes are not illustrated).

With the above-described p-type MOSFET 370 and n-type 380, a low voltage logic circuit such as a CMOS circuit, can be formed to be used for a control circuit of the p-type lateral high breakdown voltage MOSFET 300 and the n-type lateral high breakdown voltage MOSFET 350.

In this way, with a use of the diffused layers simultaneously formed with the diffused layers of the lateral high breakdown voltage MOSFETs, a low breakdown voltage MOSFET can be formed, which makes it possible to form high breakdown voltage devices and low breakdown voltage devices on the same chip without increasing the number of process steps.

As explained above, a thickness of a gate oxide film is formed to a thickness in which an electric field value to an absolute maximum rated voltage between a source and a drain becomes equal to or less than 4 MV/cm. Moreover, the above-described drain diffused layer is formed so that a total amount of impurities therein is equal to or more than $2 \times 10^{12}/cm^2$ (preferably $3.0 \times 10^{12}/cm^2$ or more). With such an arrangement, a drain diffused layer becomes hard to be depleted and a depletion layer extends towards a side of the body diffused layer (the n-well layer). Furthermore, a considerable portion (of the order of about 80%) of the voltage between the source and the drain is carried by the gate oxide film.

Thus, the sheet resistance of the drain diffused layer becomes smaller by an increased amount of total amount of impurities. Therefore, when an arrangement is provided with the total amount of impurities taken as $3.0 \times 10^{12}/cm^2$, the sheet resistance of the drain diffused layer and the drift length can be brought to ⅓ and ½, respectively, compared with those of the conventional MOSFETs.

Most of an on-resistance component (of the order of 90%) in a lateral high breakdown voltage MOSFET is occupied by the drain resistance. Thus, the drain resistance can be brought to ⅙.

Moreover, a length of a channel length plus a length of a drift region is also somewhat shortened to 8 mm compared with 9 mm of a conventional length.

As a result, even with a length taken into consideration by which the channel length is increased compared with that in the example of the conventional MOSFET, the p-type lateral high breakdown voltage MOSFET with equal on-resistance to that of a conventional one can be formed with a channel width of ⅓ of the conventional one. Furthermore, along with reduction in a device pitch due to reduction in the length as the above-described channel length plus the length of the drift region, the device area can be reduced down to ⅓ or less.

Further, with respect to the case of forming an integrated circuit device (IC) by integrating a plurality of p-type lateral high breakdown voltage MOSFETs, an area of each individual p-type lateral high breakdown voltage MOSFET becomes ⅓ or less, which enables considerable downsizing as the integrated circuit device to allow considerable reduction in cost of the chip.

In addition, in the case of forming the integrated circuit device by integrating the p-type lateral high breakdown voltage MOSFET together with a n-type lateral high breakdown voltage MOSFET, a driving circuit for the high breakdown voltage devices, other peripheral circuits, and the like, an area of the p-type lateral high breakdown voltage MOSFET previously having occupied a large area becomes ⅓ or less. As a result, the integrated circuit device may be downsized and a flexibility in a device layout is enhanced.

In particular, in the case of such a device as a PDP driver IC in which a plurality of p-type lateral high breakdown voltage MOSFETs and n-type lateral high breakdown voltage MOSFETs are integrated, the enhanced flexibility in the device layout allows the chip area to be effectively used. Thereby, along with reduction in the occupying area of the lateral high breakdown voltage p MOSFET, further downsizing and cost reduction of the IC may be provided.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor device, comprising:
  a lateral high breakdown voltage MOSFET comprising
    a buried layer formed in a region of a semiconductor substrate,
    a drain diffused layer formed on a surface side on the buried layer,
    a body diffused layer formed by diffusion on the surface side on the buried layer surrounding the drain diffused layer,
    a source diffused layer formed in the body diffused layer at a specified distance from a boundary of the drain diffused layer,
    a drain contact diffused layer formed on a surface side of the drain diffused layer,
    a gate oxide film formed on a surface of the body diffused layer, from an end of the source diffused layer over a portion of the drain diffused layer,
    a field oxide film formed on the surface of the drain diffused layer, in a region without the drain contact diffused layer and the gate oxide film, and
    a gate electrode formed above the gate oxide film over a portion of the field oxide film, wherein the gate oxide film comprises a thickness in which an electric field value of an absolute maximum rated voltage between a source and a drain is equal to or less than 4MV/cm, and a total amount of impurities in the drain diffused layer is equal to or more than $2\times10^{12}/cm^2$; and
  a lateral low breakdown voltage MOSFET.

2. The lateral high breakdown voltage MOSFET as recited in claim 1, wherein the drain diffused layer, the source diffused layer, and the drain contact diffused layer are of a first conduction type and the body diffused layer and the semiconductor substrate are of a second conduction type.

3. The semiconductor device as recited in claim 1, wherein the lateral low breakdown voltage MOSFET is simultaneously formed in a diffused layer with the drain diffused layer.

4. The semiconductor device as recited in claim 1, wherein the lateral low breakdown voltage MOSFET is simultaneously formed in a diffused layer with the body diffused layer.

5. The semiconductor device as recited in claim 1, further comprising:
  a first lateral low breakdown voltage MOSFET of a first conduction type simultaneously formed in a diffused layer with the body diffused layer; and
  a second lateral low breakdown voltage MOSFET of a second conduction type simultaneously formed in the diffused layer with the drain diffused layer, where the first and second lateral low breakdown voltage MOSFETs form a CMOS circuit.

6. The lateral high breakdown voltage MOSFET as recited in claim 1, wherein a distance between the source diffused layer and the drain diffused layer is longer than a projected length of the drain diffused layer from the drain contact diffused layer.

7. The lateral high breakdown voltage MOSFET as recited in claim 1, wherein a length of the gate electrode on the field oxide film is equal to or less than 2 mm.

8. The lateral high breakdown voltage MOSFET as recited in claim 1, wherein widths of depletion layers on an uppermost surface side of a semiconductor layer are $W1<W2$ when a reverse bias voltage is applied between the source and the drain,
  where W1 is a width of one of the depletion layers extending toward a side of the drain diffused layer, and
  W2 is a width of another of the depletion layers extending toward a side of the body diffused layer.

9. The lateral high breakdown voltage MOSFET as recited in claim 1, wherein the lateral high breakdown voltage MOSFET is a lateral low breakdown voltage MOSFET of a first conduction type and is simultaneously formed in a diffused layer with the body diffused layer of a second conduction type.

10. The lateral high breakdown voltage MOSFET as recited in claim 1, wherein a lateral low breakdown voltage MOSFET of a second conduction type is simultaneously formed in a diffused layer with the drain diffused layer of a first conduction type, a lateral low breakdown voltage MOSFET of the first conduction type is formed in a diffused layer simultaneously formed with the body diffused layer of the second conduction type, and the low breakdown voltage MOSFETs of the first and second conduction types form a CMOS circuit.

* * * * *